(12) United States Patent
van Heijningen

(10) Patent No.: US 10,940,682 B2
(45) Date of Patent: Mar. 9, 2021

(54) PHOTOSENSITIVE STENCILS AND METHODS

(71) Applicant: Procraft Development B.V., Alphen aan den Rijn (NL)

(72) Inventor: Dirk Jan van Heijningen, Alphen aan den Jijn (NL)

(73) Assignee: Procraft Development B.V., Alphen aan den Rijn (NL)

( * ) Notice: Subject to any disclaimer, the term of this patent is extended or adjusted under 35 U.S.C. 154(b) by 50 days.

(21) Appl. No.: 15/462,607

(22) Filed: Mar. 17, 2017

(65) Prior Publication Data

US 2017/0246852 A1     Aug. 31, 2017

Related U.S. Application Data

(63) Continuation of application No. 14/637,310, filed on Mar. 3, 2015, which is a continuation of application No. 13/150,394, filed on Jun. 1, 2011.
(Continued)

(51) Int. Cl.
*B41C 1/14* (2006.01)
*G03F 7/12* (2006.01)
*B41F 15/34* (2006.01)

(52) U.S. Cl.
CPC .............. *B41C 1/147* (2013.01); *B41F 15/34* (2013.01); *G03F 7/12* (2013.01)

(58) Field of Classification Search
CPC .......... B41N 1/24; B41N 1/241; B41N 1/242; B41N 1/245; B41N 1/247; B41N 1/248; B41F 15/34
See application file for complete search history.

(56) References Cited

U.S. PATENT DOCUMENTS

| 2,427,447 A | 9/1947 | Dicks |
| 3,246,986 A | 4/1966 | Borchers |

(Continued)

FOREIGN PATENT DOCUMENTS

| CA | 2088400 A1 | 1/1994 |
| EP | 0 150 623 A2 | 8/1985 |

(Continued)

OTHER PUBLICATIONS

Extended European Search Report, dated Jul. 6, 2011, for European application No. 09176112.2, 3 pages.
(Continued)

*Primary Examiner* — Jennifer E Simmons
*Assistant Examiner* — Quang X Nguyen
(74) *Attorney, Agent, or Firm* — Seed IP Law Group LLP; Jared M. Barrett

(57) ABSTRACT

A photosensitive stencil includes a porous stencil carrier that can be a sheet of woven material with crisscrossing filaments. The stencil carrier is coated with a photopolymer emulsion that is water based to form a stencil blank. In use, a light mask is disposed atop the stencil blank. The light mask can be contained on a sheet of paper or a transparent film. Alternatively the stencil blank is fed through an inkjet printer and the light mask is printed directly onto the stencil blank using common inks. The stencil blank is then exposed to light for a few minutes, which cross-links the photopolymer emulsion in unmasked regions. After exposure, the stencil blank is developed by being washed out with water. The water removes emulsion and adhesive, where present, within areas that were masked by the light mask, revealing open or open regions through which ink or paint can be applied.

14 Claims, 17 Drawing Sheets

Related U.S. Application Data

(60) Provisional application No. 61/350,670, filed on Jun. 2, 2010, provisional application No. 61/372,543, filed on Aug. 11, 2010.

(56) References Cited

U.S. PATENT DOCUMENTS

| | | | |
|---|---|---|---|
| 3,532,052 | A | 10/1970 | Erickson |
| 3,961,050 | A | 6/1976 | Stach |
| 4,021,243 | A | 5/1977 | Steppan et al. |
| 4,096,308 | A | 6/1978 | Reed |
| 4,262,084 | A | 4/1981 | Kinney |
| 4,834,833 | A * | 5/1989 | Palmer ............... B24C 1/04 156/154 |
| 4,961,811 | A | 10/1990 | Haugwitz |
| 5,061,603 | A * | 10/1991 | Hamilton ............ C07D 213/89 430/287.1 |
| 5,459,011 | A | 10/1995 | Iida et al. |
| 5,718,170 | A * | 2/1998 | Watanabe ............ B41C 1/147 101/128.21 |
| 5,994,033 | A | 11/1999 | Davidson et al. |
| 10,155,374 | B2 * | 12/2018 | Ohnishi ............... B41C 1/147 |
| 2001/0000382 | A1 | 4/2001 | Simons |
| 2003/0051801 | A1 | 3/2003 | Usami et al. |
| 2004/0118305 | A1 | 6/2004 | Martinez et al. |
| 2008/0028955 | A1 * | 2/2008 | Bauer ................. B41F 15/26 101/44 |
| 2010/0258014 | A1 * | 10/2010 | van Heijningen ....... B41C 1/14 101/128.4 |

FOREIGN PATENT DOCUMENTS

| | | |
|---|---|---|
| EP | 0 220 121 A2 | 4/1987 |
| EP | 492351 A1 * | 12/1991 ............... B41C 1/14 |
| EP | 0 909 662 A2 | 4/1999 |
| EP | 1 213 327 A1 | 6/2002 |

OTHER PUBLICATIONS

Extended European Search, dated Dec. 21, 2011, for European application No. 11168459.3, 7 pages.

* cited by examiner

Daylight inside

Synthetic route of PVA-SbQ emulsion

Crosslinked PVA-SbQ emulsion

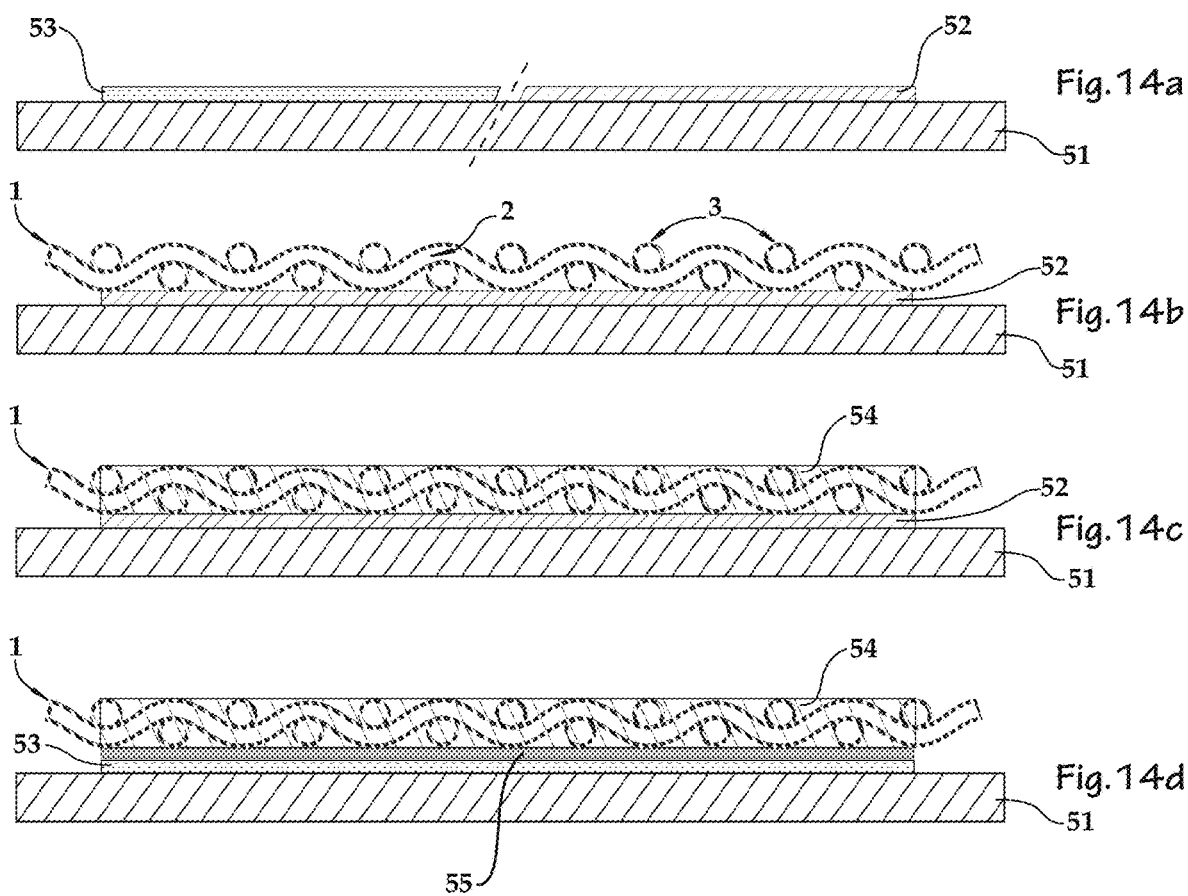

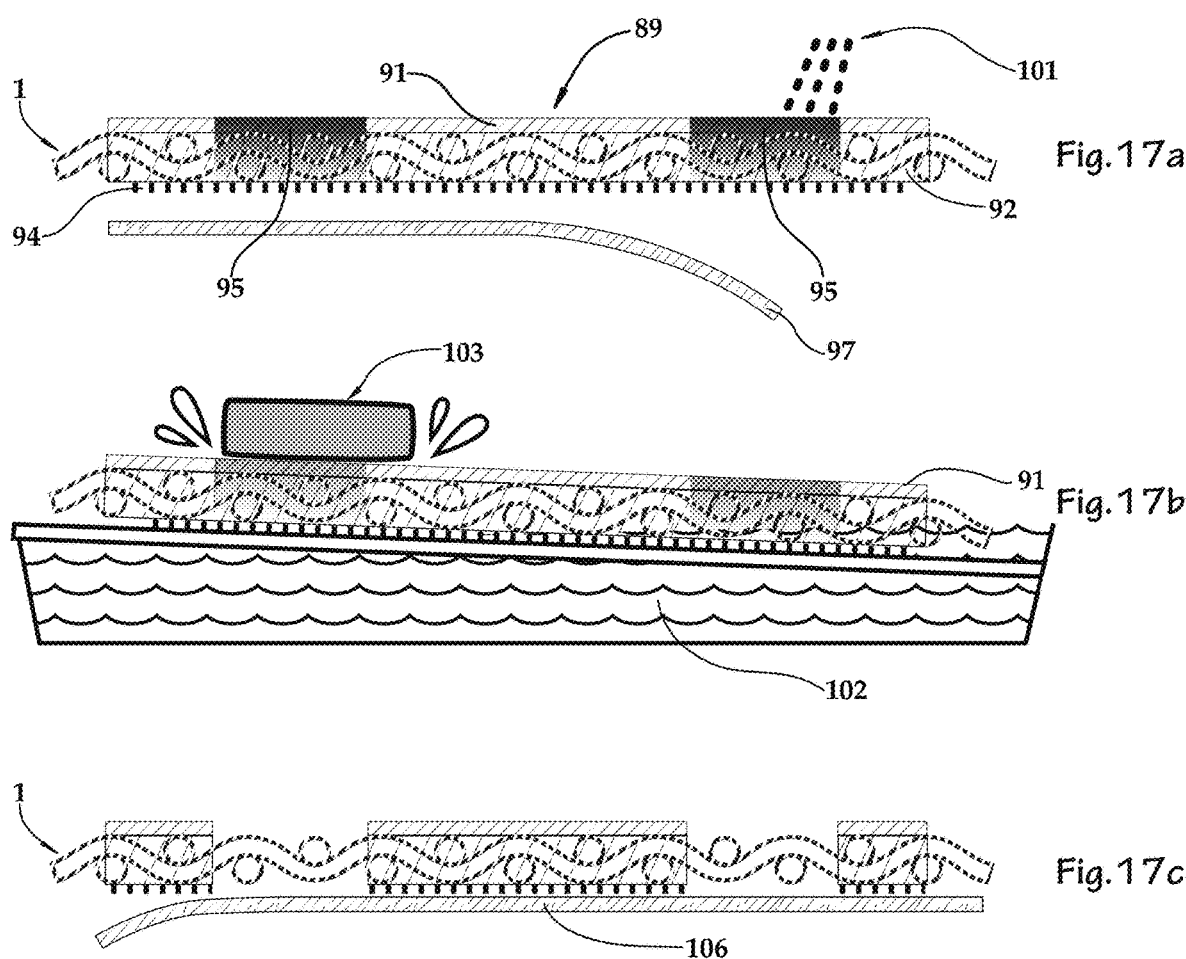

PHOTOSENSITIVE STENCILS AND METHODS

REFERENCE TO RELATED APPLICATION

This application is a continuation of U.S. patent application Ser. No. 14/637,310, filed Mar. 3, 2015, which is a continuation of U.S. patent application Ser. No. 13/150,394, filed on Jun. 1, 2011, which claims the benefit of U.S. provisional patent application No. 61/350,670, filed Jun. 2, 2010, and U.S. provisional patent application No. 61/372,543, filed Aug. 11, 2010, each of which is hereby incorporated by reference for all purposes as if fully set forth herein.

BACKGROUND

Technical Field

This disclosure relates generally to stencils for applying decorative graphic patterns, images, and/or indicia to surfaces and more particularly to photosensitive stencil blanks that can be masked, exposed, and developed by consumers in a home or classroom environment to create a stencil with a selected graphic. The disclosure further relates to methods of making and methods of using such stencils.

Description of the Related Art

Decorative stenciling by applying ink, paint, paste, or other art media through patterned cutouts in a stencil sheet has been popular for home decoration, textile craft, and as a limited or custom production method to decorate surfaces. Stenciling can accurately and repetitively transfer artistic and graphic patterns, designs and lettering or other indicia to the surfaces of a variety of objects and backgrounds enhancing the attractiveness of or personalizing the objects and backgrounds. Generally, decorative graphic designs and/or indicia are applied to a surface by placing a stencil on the surface and applying pigments in the form of liquid ink, paint, paste or other art media to the surface through cut-out regions of the stencil. The pigments are fixed to the surface by drying, glazing, or curing. In particular, wood, plaster, drywall, textiles, metallic, ceramics, and glass objects commonly are adorned with decorative stenciling.

Historically, stencils have been commercially produced with a wide gamut of graphic patterns and these stencils are purchased by users for applying the graphic patterns to a surface. A variety of methods for reproducing an original graphic design or artistic image in a stencil have been used commercially including, for example, dye cutting, metal etching, router cutting, laser cutting and other techniques. Such techniques involve, among other things, the fabrication of dye cutting knives, hand tooling, metal etching, digitizing for router and laser cutting, and high volume production facilities. Such techniques, however, have certain shortcomings and limitations, particularly in the accurate reproduction of fine details of a design. For example, if the method of stencil production is by routing or laser cutting, the radius of the router or the laser beam limits the precise duplication of the design in its small details. If the stencil production method is die cutting, the reproduction of the original image in the stencil is restricted by the limitations of die making. Printed and etched stencils have limitations resulting from printing registration restrictions. Further, common stencil sheet materials such as paperboard, polypropylene, vinyl, and polyester are relatively ridged and thick and it is difficult for them to contour to the surfaces of curved and structured objects such as ceramics and fabrics.

Average consumers, decorators, and crafters can be limited to the designs available from commercial manufacturers with the above and other limitations. Consumers traditionally have not been able to make their own customized stencils without painstaking manual tracing, drawing, and hand-cutting. Even when consumers do make their own stencils in this manner, the edges of the cut-out regions often are not crisply and cleanly cut, which can lead to problems when applying art media. Further, traditional stencils and homemade stencils are generally formed with bridges spanning cut-out regions to ensure the mechanical integrity of the stencil. However, such bridges form obstructions that appear as gaps in an applied graphic design and these gaps must be filled in with art media after the design is applied. Such touch-ups often are apparent and considered by some to be unsightly.

Proper application of a decorative design to a surface to recreate accurately the original art in shape and size requires that a dimensionally stable and stretch-free stencil be retained in close contact with a surface to be decorated, especially around the edges of cut-out regions. This is required to avoid spilling, smudging, undercutting, or seepage of the art medium being applied through the stencil's cut-out regions. Flat hard surfaces such as walls present less of a problem in this regard, as a flat stencil sheet can be closely pressed to and held against the flat surface and, if necessary, secured by tape during the application of the stencil design. However, curved or irregular surfaces and textiles present more of a challenge. Surfaces with radial shapes and double curves, for example, are much more difficult to wrap with a traditional stencil in such a way that the stencil remains in close contact with all portions of the surface. If the stencil design is not in close contact with the surface, art media will leak and spread under the stencil when applied, resulting in an unacceptably poor image.

Sheet stencil patterns have traditionally been reproduced in a variety of stencil materials such as paperboard, metal sheets, and plastic sheets. Successful application of pigments through cut-out regions of such stencils typically requires an ancillary way of adhering the stencils to a surface to be decorated. These have included, for example, the use of adhesive masking tape, spray adhesive, rubber cement, and similar techniques. However, the residues left by tape or adhesive are undesirable, especially where the liquid art medium applied seeps under the stencil mask outside the design area. Taping the stencil pattern is particularly ineffective, as the adherence of the interior edges of the cut-out regions of the design cannot be taped without blocking the application of art media and art media can seep beneath these edges.

Applicant believes a need exists for a system that permits average consumers, decorators, and crafters to create accurate high quality custom stencils quickly and easily in their own homes or classrooms using common equipment and materials. Such a system should result in stencils without support bridges in the open regions and with open regions bordered by crisp clean lines so as to produce a crisp high quality graphic image on a surface. The system should result in stencils that are sufficiently flexible to be conformed to curved surfaces and to adhere to and retain close contact with such surfaces during application of a graphic image. Stencil making using such a system should be sufficiently quick to accommodate virtual real-time coordination with instructive television programs and the like to allow viewers to follow along with the programs using just-made stencils. Stencil patterns, in addition to being custom created by users, should be easily downloadable using a computer or an app on a mobile device. It is to the provision of a system and methods that meet these and other needs that embodiments of the present invention are primarily directed.

BRIEF SUMMARY

U.S. provisional patent application No. 61/350,670 and U.S. provisional patent application 61/372,543, to each of which priority is claimed above, are hereby incorporated by reference in their entireties.

Briefly described, a system and methods are disclosed that facilitate the making of high quality stencils by consumers in homes and classrooms using common and safe equipment and materials. Stencils are produced exceedingly quickly, have no bridges to obstruct application of art media, are flexible for use with irregular or curved surfaces, and are reusable. The system includes stencil blanks comprising a porous stencil carrier coated with a photosensitive polymeric (photopolymer) emulsion, such as polyvinyl alcohol with pendent styrylpyridinimm (PVA SbQ), with optional pressure sensitive adhesive on one surface. The adhesive may be a photosensitive polymer or a non-photosensitive water resistant copolymer. The emulsion is soluble in water in its native state. When exposed to light, however, a chemical cross-linking reaction occurs in the emulsion causing it to cross-link and become firm and fixed in the stencil carrier. Once exposed and cross-linked, the emulsion and adhesive are no longer soluble in water. In one embodiment, an adhesive layer comprises an array of spaced apart microdots of pressure sensitive adhesive embedded in or applied onto a surface of the photosensitive emulsion. The adhesive of this embodiment is a copolymer, non-photosensitive, and is not soluble in water. However, since the microdots are of a miniscule diameter, they simply wash away with the emulsion when the emulsion dissolves in water. In a second embodiment, the adhesive is photosensitive and soluble in water in its native state and may be applied as a thin film on a surface of the photosensitive emulsion. In a third embodiment, the stencil may be fabricated with no adhesive at all. In such an embodiment, a completed stencil may be mounted in a relatively flexible frame with an adhesive surface that holds the frame and the stencil to a surface during application of art media.

In order to create a stencil with open regions through which art media is applied, a light mask is applied to the stencil blank. These open regions correspond to cut-out regions in traditionally fabricated stencils as described above. The light mask can be an overlay such as a print on a sheet of paper or film, or preferably the stencil blank is simply fed through an inkjet printer and the mask is printed directly onto the blank from a stored digital image with the normal inks of the printer. An embodiment of the stencil blank with no adhesive but possibly with a smooth flat ink receiving surface is suited for application of the light mask with an inkjet printer since there is no adhesive to stick to transport mechanisms of the printer. As described below, however, the inventor has discovered that a stencil blank with an adhesive surface that is capable of being fed through an inkjet printer also is possible. In any event, substantially opaque regions covering the stencil blank that correspond to desired open regions of the finished stencil are created.

After the light mask is applied, the stencil blank is exposed to light, which can be sunlight, or artificial light, or light from a specially designed bulb or source. Significantly, the required light has an electromagnetic spectrum that is safe for human skin and eyes and may include parts of the spectrum of visible light. In regions not covered by the light mask, the photopolymer emulsion is exposed to the light, cross-links, firms, and becomes non-soluble in water. If a photosensitive adhesive layer is present, the same happens to this layer. However, in regions covered by substantially opaque portions of the light mask, the light is blocked from falling onto the photopolymer emulsion and the emulsion in these regions does not cross-link. After exposure for a sufficient time, which can be surprisingly short, the stencil blank is developed by washing it in water. The water dissolves and removes the non-cross-linked emulsion in regions that were masked with the light mask while not affecting the emulsion in cross-linked regions that received exposure to the light. As a result, open regions are formed where the emulsion washed away and the porous stencil carrier is exposed in these open regions. If the adhesive is photosensitive, it too dissolves in the water in precise registration with the emulsion. If the adhesive is not photosensitive but rather applied as microdots of copolymer, then the microdots simply wash away with the emulsion.

The stencil is then dried and can be used by pressing the stencil to a surface and applying ink, paint, or other art media through the porous carrier exposed within the open regions. The porous carrier supports the stencil mechanically so that no bridges need be present within open regions. Further, for stencils with adhesive, which preferably is a pressure sensitive adhesive, the adhesive sticks to the surface forming close and intimate contact between the stencil and the surface, particularly at edges surround the open regions. Where adhesive is not used, the finished stencil may be mounted in a relatively flexible frame that itself has an adhesive surface. In this embodiment, the frame is stuck to a surface to be decorated and supports the stencil against the surface. It also has been found that creating a smooth flat ink receiving surface, which may or may not be glossy, on a non-adhesive stencil blank ensures that printed-on light masks are crisp and clear and also that the smooth flat surface has inherent cling that can substitute for an adhesive. Art media can be applied with a brush, sponge, a squeegee, or other appropriate tool, whereupon the stencil is removed to reveal the graphic design on the underlying surface. A stencil made using the system and methods of the invention is significantly more flexible that traditional stencils so that it conforms more easily to curved or textured surfaces. The adhesive outside the open regions of the stencil or an adhesive frame ensures that the resulting image is formed with crisp clean edges and details because the adhesive or adhesive frame sticks the stencil to a surface in intimate contact. The cling of a smooth flat ink receiving surface also may help stick the stencil to a surface.

A stencil can be made according to aspects of the invention in a surprisingly short time on the order of just a few minutes. This opens many possibilities for methods of using the stencil making techniques and stencils disclosed herein. One such possibility, for example, is that instructional television programs about decorating with stencil's can be produced that allow viewers to make the same stencil being used on the program and follow along with the instructions of the host at home. The host might, for instance, instruct viewers early in the show to download a digital design from a specified web location using their computers or a special app on their mobile devices. The design can then be printed by each viewer on a stencil blank of embodiments of this invention with an inkjet printer, and the blank exposed and developed in water to form a stencil in just a few minutes. Stencils may, for instance, be made during a commercial break or during a general discussion by the program host. When a viewer's stencil is ready, the program can continue and viewers with their newly made stencils can follow along with the host using the same stencil being demonstrated on the television program. Many other possibilities are made possible using the stencil and methods disclosed herein.

Accordingly, one aspect of the invention is a stencil that will adhere to the surface of an object being decorated without the use of auxiliary tape or glue. Another aspect is a stencil that achieves close contact of the stencil throughout its extent with the surface being decorated and that will remain fixed on the surface during application of paint or other art media. An additional aspect is a stencil and stenciling technique that leaves no foreign residue on a surface after the stencil is removed. Yet another aspect is a stencil in which the adhesiveness of the stencil can be regenerated by cleaning with water to remove dust or textile so that the stencil can be used over and over. A further aspect is a stencil and stenciling method that eliminates leaking, seeping, or inexact art medium application through the stencil open regions by adhering to a surface in adjacent masked regions to ensure that there are no gaps between edges of open regions and a surface to be decorated. A smooth, uniform and precise application is thus ensured by the adherence of the stencil to a surface being decorated. A still further aspect is a photosensitive removably adherent stencil that will lift cleanly from a decorated surface and that retains its dimensions without stretching, deforming, or movement that might blur or disturb the art medium applied.

An aspect of the embodiment where no adhesive is used is that the stencil blank can be fed cleanly through a common inkjet printer for application of a light mask directly to the emulsion. Since this embodiment has no adhesive, it can be attached when completed to a relatively flexible frame or other support structure that itself has an adhesive surface to support the frame and the stencil on a surface. In a related embodiment, a non-adhesive stencil suitable for inkjet printing is formed with a smooth flat surface that receives inked images with crisp precise edges and generates cling that helps hold the stencil to a surface to be decorated. In another embodiment, an inkjet compatible stencil blank with an adhesive surface is disclosed. In such an embodiment, the adhesive surface is covered with a protective sheet during the printing and the light mask is printed onto the opposite or secondary side of the stencil blank. The ink solvents penetrate through the stencil blank to the primary adhesive bearing surface to result in an exposed and developed stencil with crisp clean edges surrounding open regions.

Thus, a stencil, stenciling system, and methods are disclosed that address and overcome issues associated with the reproduction of stencil designs by hand tracing or digitizing or scanning an original design and tracing it with the aid of software programs, and then cutting out the shapes of the designs to form a stencil. With the presently disclosed system and methods, fine graphic details of an original image are reproduced faithfully on the finished stencil. Decorative stencil patterns and images of a user's own design or of stock designs can be reproduced in stencil form without the necessity of tracing, cutting, or other restricted mechanical means. The stencil image can be hand drafted on paper, downloaded from public domain internet banks, or digitized from a print by scanning or other digitizing techniques. A digitized image can be printed by an inkjet or laser printer or otherwise digitally produced on ordinary paper or transparent filmic material that can serve as a light mask when placed on the surface of a stencil blank. More preferably, however, a digitized image is simply printed directly onto a stencil blank using an ordinary inkjet printer and ordinary inks and this printed image functions as a light mask during exposure of the blank to light. These and other aspects, features, and advantages of the disclosed stencil system and methods will become more apparent upon review of the detailed description set forth below when taken in conjunction with the accompanying drawing figures, which are briefly described as follows.

BRIEF DESCRIPTION OF THE SEVERAL VIEWS OF THE DRAWINGS

FIGS. 14a-14d illustrate an alternate method of making a stencil blank without adhesive and suited for use with inkjet printers.

FIGS. 17a-17c illustrate the development of the exposed stencil blanks of FIG. 16 in water to create a stencil.

DETAILED DESCRIPTION

Figure 1A:
FIGS. 1a-1e are cross-sectional views of a section of a porous carrier for a stencil and illustrate various treatment and/or calendaring thereof as an initial step of fabricating a stencil blank.

Reference will now be made to the various drawing figures, wherein like reference numerals may indicate like parts throughout the several views. FIGS. 1a-1e illustrate variations of a material that has been found to serve well as a stencil carrier of stencils according to embodiments of the invention. FIG. 1a depicts a carrier 1 in the form of a woven screen or mesh of crisscrossing filaments with filaments 2 extending generally at right angles or transversely with respect to filaments 3. The material from which the filaments are made can be selected from a number of possibilities including, but not limited to, Polyethylene terephthalate (PET or PETP), Polyamide (PA 6.6), a polyester-based polymer such as SST, and other materials that exhibit dimensional stability. The filament diameter and the spacing of the filaments or mesh size in a woven stencil carrier, which determines the sizes of the open areas of the mesh, are optimized to allow passage of a variety of different art media such as, for instance, inks, paints, pastes, and fillers. Decorative art media may comprise, for example, fine glitter or mica pigments, glass reflective spheres, or special effect course fillers all of which have different sizes and need to pass through the open areas of the stencil carrier. It has been found that a mesh size of approximately 27-48 metric mesh with a filament diameter of approximately 120-70 µm results in a stencil carrier that passes such art media well and thus is considered to be a preferred embodiment of the stencil carrier material. The stencil carrier also must support emulsion and possibly adhesive layers, detailed below, with thicknesses that are optimized to form masking and adhesion properties appropriate for applying designs to a wide variety of surfaces such as, for instance, course walls, wood grain, painted and coated metals, textiles, ceramics, and glass to name a few. A mesh with the above specifications has been found to meet this need as well.

As mentioned, the stencil carrier needs to be dimensionally stable and substantially rigid from side-to-side to resist stretching and deforming, particularly when a stencil is removed from a surface where wet art media has recently been applied. Nevertheless, the stencil carrier should be flexible to be conformed to curved surfaces when necessary. The mesh rigidity should result in a sheet-like stencil carrier with good dimensional stability to avoid deformation of the size and shape of an original design reproduced in the completed stencil. It has been found that calendaring or treating the mesh to interlock or bond its filaments can achieve the desired rigidity and dimensional stability. In addition, the shore hardness and formulation of the photo emulsion to be applied to the stencil carrier and that of the stencil carrier itself has proven to be important in the formation of a stable stencil blank.

Figure 1B:
Figure 1C:
Figure 1D:

A number of techniques may be used to enhance the rigidity and dimensional stability of the stencil carrier. FIG. 1b for instance illustrates a woven carrier that has been chemically treated to enhance its dimensional stability. The mesh may be treated with a number of chemicals known in the art including, for instance, low solids epoxy or UV acrylic monomers. Chemical treatment tends to bond the filaments of the mesh together at their intersections and thereby interlocks them to enhance the stability and rigidity of the carrier sheet. FIG. 1c illustrates a woven carrier that has been corona or plasma treated by known methods to condition the surfaces of the filaments and promote adhesion of coatings to be applied to the carrier. FIG. 1d illustrates a carrier sheet that has been heat calendared or pressed between rollers to fuse the filaments of the mesh together and thereby enhance the dimensional stability of the carrier. These and other techniques for enhancing dimensional stability and in-plane rigidity of the carrier may be used and any such technique should be considered to fall within the scope of embodiments of the invention exemplified herein.

Figure 1E:
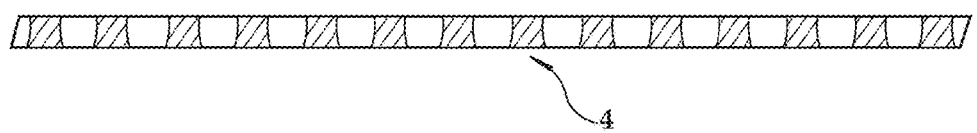

While woven carriers function well, embodiments of the invention are not limited to a carrier made from woven filaments. FIG. 1e for instance illustrates a micro perforated sheet of non-woven material that may be used as an alternative to a woven mesh material. Any non-woven sheet material may be used so long as it is suitable for micro perforating and exhibits the rigidity and dimensional stability desired for the carrier.

Figure 2A:
FIGS. 2a-2d are cross-sectional views illustrating alternate techniques for coating a porous carrier with photopolymer emulsion according to embodiments of the invention.

FIG. 2a illustrates a subsequent step in the process of fabricating a stencil blank according to one embodiment of the invention. In this illustration, a woven carrier 1 that, in this case, is plasma treated as described above, is coated throughout with a PVA SbQ photopolymer sensitized emulsion. Of course, any alternative carrier such as those already described or others may be substituted. The PVA SbQ photopolymer emulsion, described in more detail below, permeates the carrier and also helps to stabilize and rigidify the sheet. The PVA SbQ photopolymer emulsion can be applied to the carrier in a number of ways including, without limitation, coating, printing and other techniques.

Figure 2B:
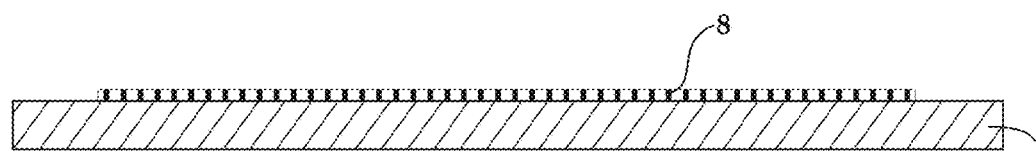
Figure 2C:
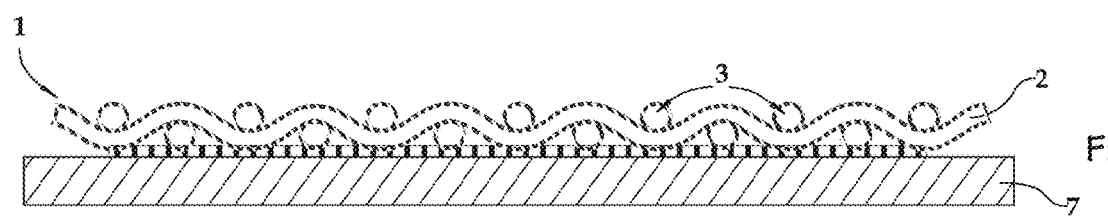
Figure 2D:
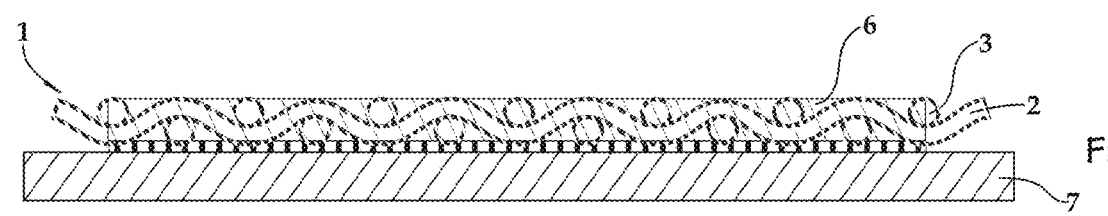

FIGS. 2b-2d illustrate one technique for producing a stencil blank with protective release layer that, when removed, exposes an adhesive surface of the stencil for sticking the stencil to a surface. In FIG. 2b, a support sheet 7, which may be a thin PET or PP material, is coated or printed on one surface with a pressure sensitive adhesive 8. The adhesive 8 may itself may be a photosensitive photopolymer similar in function to the primary emulsion but formulated such that when cross-linked exhibits a "tacky" property that allows it to stick to a surface but be removed easily and without residue. If the adhesive is photosensitive, it may be applied in a generally discontinuous pattern such as a microdot matrix as illustrated in FIG. 2b, or, more preferably, it may be applied as a continuous thin film. Alternatively, the adhesive may be a non-photosensitive copolymer and thus may not be soluble in water. In such an embodiment the adhesive preferably is applied in the microdot pattern illustrated in FIG. 2b so that the microdots become incorporated or embedded in a surface of a stencil blank, as detailed below. Microdots also may be applied to the surface of the stencil blank.

Next, as illustrated in FIG. 2c, a stencil carrier sheet, in this case a woven plasma treated mesh material is disposed on the surface of the support sheet overlying the pressure sensitive adhesive. In FIG. 2d, a PVA SbQ photopolymer emulsion is printed or coated onto the carrier sheet in such a way that the emulsion permeates the mesh of the sheet. The result is a stencil blank with a tacky surface provided by the pressure sensitive adhesive 8 and with the surface being protected by a removable release layer provided by the support sheet 7. Further, as the PVA SbQ photopolymer permeates through the stencil carrier, it encapsulates the adhesive when the adhesive is applied in a microdot pattern as illustrated in FIG. 2d and spreads onto the surface of the support sheet. If the surface of the support sheet is smooth, then the surface of the stencil blank will substantially mirror this smoothness and also be smooth when the support sheet is removed prior to use of a finished stencil. Further, the microdots of adhesive become embedded within the surface of the emulsion but remain exposed on the surface for sticking a stencil to a surface to be decorated.

Figure 3A:
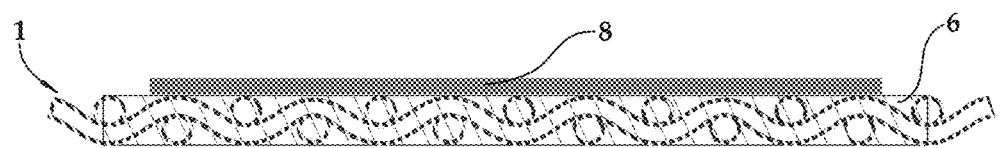
FIG. 3a-3c illustrate alternate techniques for applying and protecting a photopolymer pressure sensitive adhesive layer on the photopolymer emulsion.
Figure 3B:
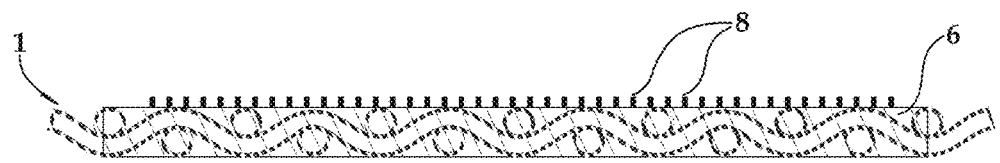
Figure 3C:
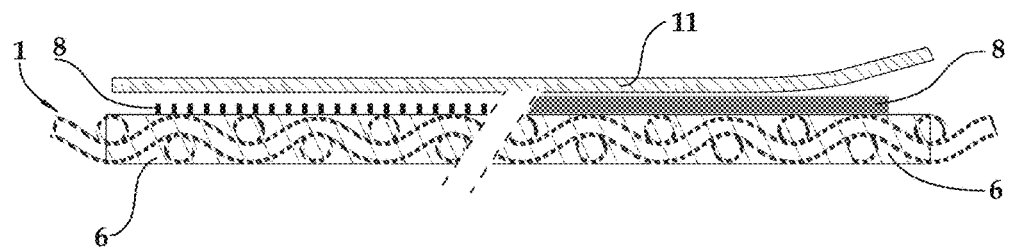

FIGS. 3a-3c illustrate alternate methods of fabricating a stencil blank according to embodiments of the invention. A stencil carrier 1 illustrated here by a woven plasma treated mesh is coated with a PVA SbQ photopolymer emulsion 6 as described above so that the emulsion permeates the carrier. A layer of pressure sensitive adhesive 8 is then applied to one surface of the PVA SbQ coating. The pressure sensitive adhesive 8 may be coated in a continuous film of photosensitive PSA as shown in FIG. 3a or it may be printed or applied in a microdot or other discontinuous pattern as illustrated in FIG. 3b. Finally, as illustrated in FIG. 3c, a protective silicone paper 11 or other appropriate protective layer is disposed atop the pressure sensitive adhesive, be the adhesive a continuous layer or a microdot pattern. The finished stencil blank, then, comprises the PVA SbQ coated stencil carrier with a pressure sensitive adhesive layer protected by a protective sheet that can be removed just before the stencil blank is to be used.

Figure 4A:
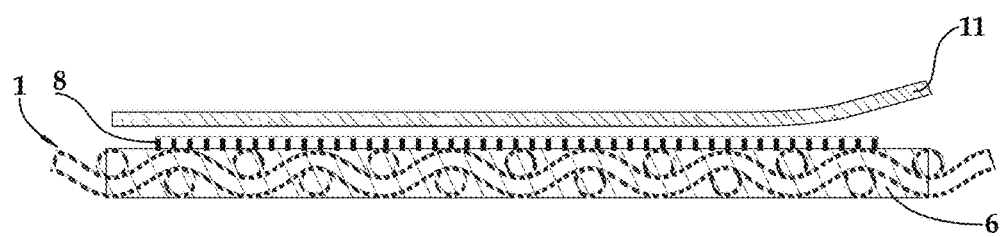
FIGS. 4a-4c illustrates alternate embodiments of light masks applied to a stencil blank and alternate techniques for exposing a masked stencil blank with light.
Figure 4B:
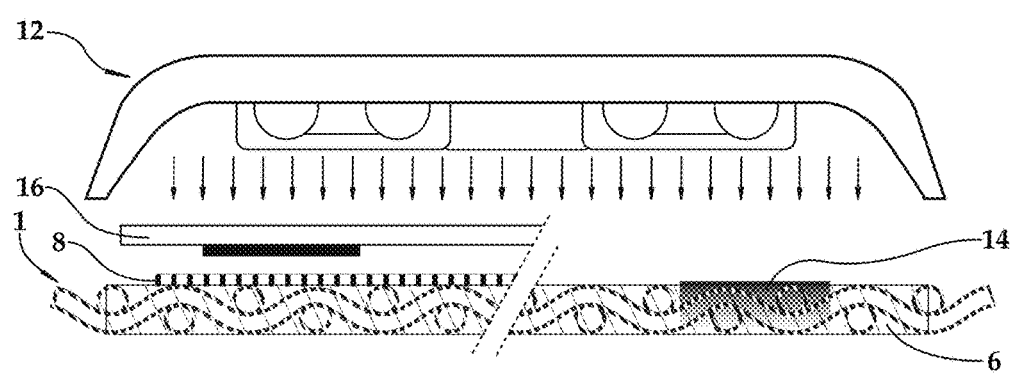
Figure 4C:
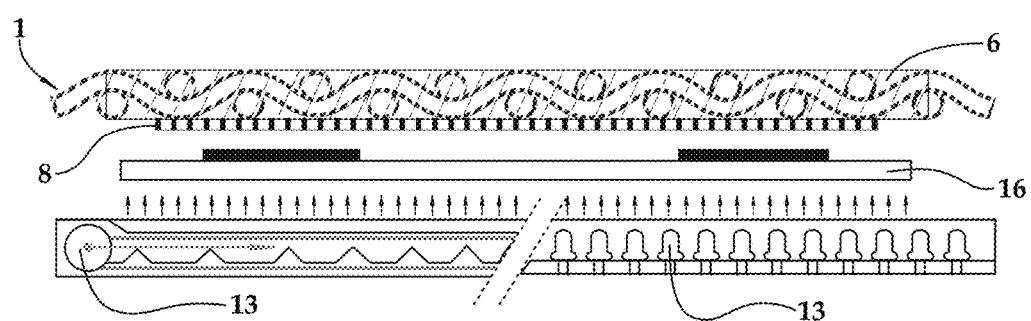

FIGS. 4a-4c illustrate one embodiment of the process of masking and exposing a stencil blank in the making by a consumer of a stencil. The stencil blank illustrated here is from the process illustrated in FIGS. 3a-3c with a microdot patterned pressure sensitive adhesive applied to one surface of the PVA SbQ photopolymer emulsion. First, the protective sheet 11 is peeled off of the stencil blank to reveal the pressure sensitive adhesive and the PVA SbQ emulsion coating. The stencil blank is then ready for exposure. An image to be reproduced as a stencil is disposed atop the exposed surface of the stencil blank. The image can be contained on a sheet of paper or transparency film that is laid atop the stencil blank as indicated at 16 in FIG. 4b. Alternatively, the stencil blank can be fed through an inkjet printer just as a sheet of paper would be and the image to be reproduced as a stencil is printed directly on the exposed surface of the stencil blank with common ink. This alternative is illustrated at 14 in FIG. 4b. For this inkjet version of the stencil blank, the blank may be made without an adhesive so that the blank will not tend to stick to transport mechanisms of an ink-jet printer during application of the light mask. While both alternatives are illustrated in these figures simultaneously, it will be understood that normally only one option is selected and used at a time. In either case, the image has transparent or translucent portions that correspond to and overlie what will be the mask portion of the finished stencil and dark or substantially opaque portions that will become the open regions of the finished stencil.

With the image applied atop the stencil blank, the blank is exposed by being illuminated with light. The light may emanate from a source with florescent bulbs 12 as indicated in FIG. 4b or from an LED or CCFL flat screen device as indicated at 13 in FIG. 4c. The masked stencil blank also may be exposed to sunlight, the light of incandescent bulbs, or other light having the appropriate spectrum as detailed below. It has been found that the time required to expose the PVA SbQ emulsion coating sufficiently can vary significantly depending upon the source of light used for the exposure.

In un-masked regions of the stencil blank, the PVA SbQ emulsion is irradiated by light from the source. However, in masked regions of the stencil blank, light from the source is blocked and PVA SbQ emulsion beneath these regions receives little or no light energy. The inventor has also discovered that the solvents and other materials contained in standard ink when wet enhance the ability of a printed-on image to block light when still in their liquid states. It is therefore desirable when printing a light mask directly onto the stencil blank with an inkjet printer that the blank be exposed quickly after printing and before the solvents in the ink evaporate. This reduces exposure time and helps produce sharper and crisper edges surrounding open regions of the finished stencil.

Figure 5A:
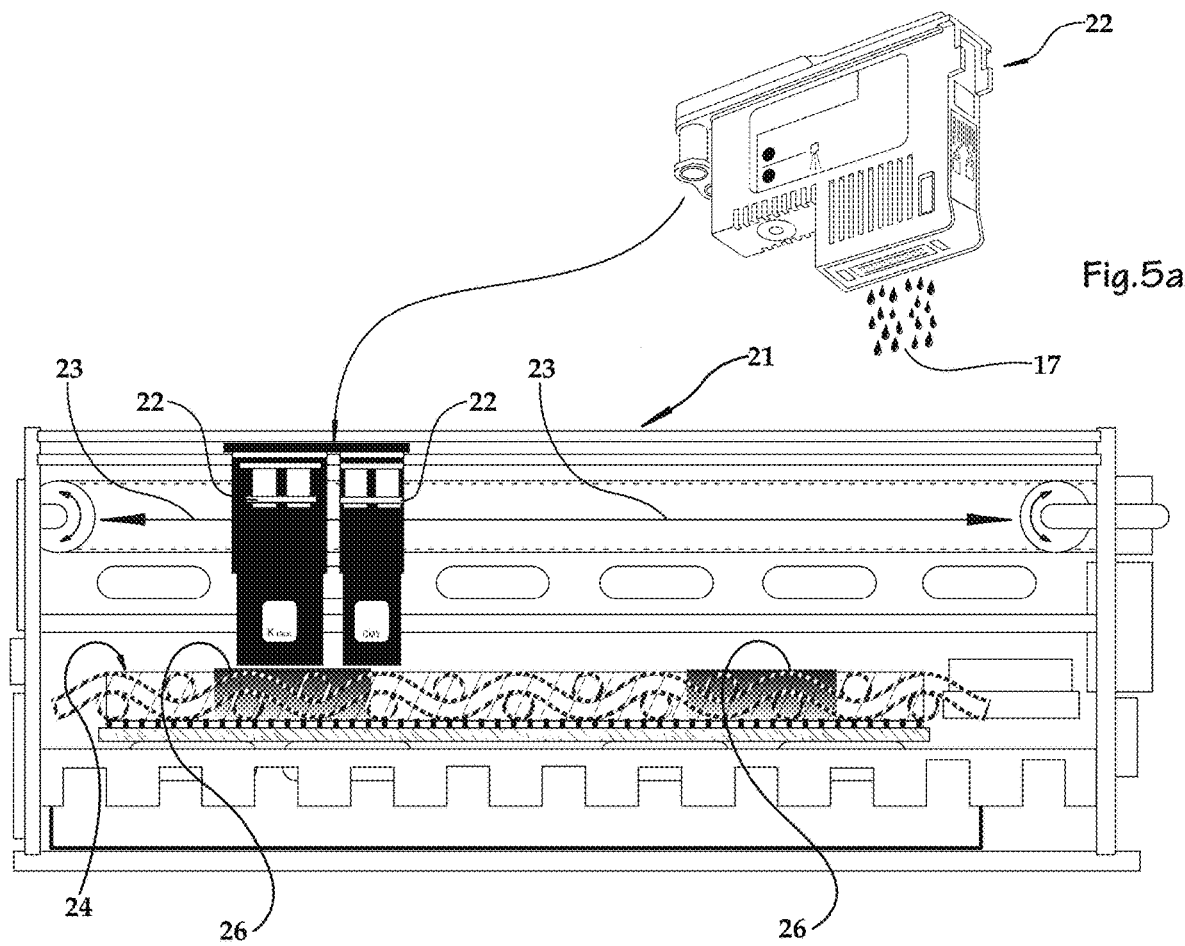
FIGS. 5a-5b illustrate in more detail the application of a light mask directly to a stencil blank by printing the mask on the blank with an inkjet printer and also illustrate exposure of the resulting masked stencil blank with light.
Figure 5B:
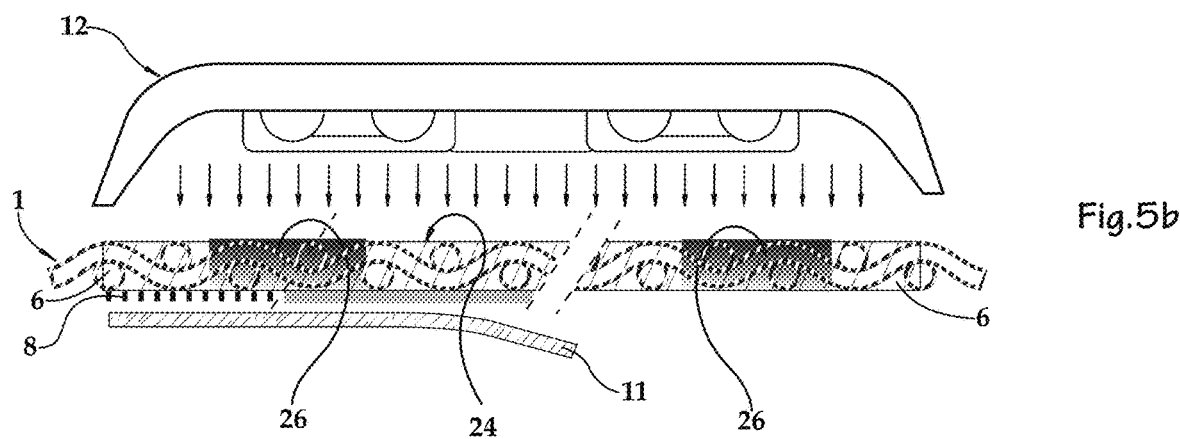

FIGS. 5a and 5b illustrate in more detail the process of applying a light mask directly to the surface of a stencil blank using an inkjet printer. In FIG. 5a, a generic inkjet printer 21 has print heads 22 that carry ink cartridges 16 containing standard ink. The print heads 22 are moved back and forth as indicated by arrows 23 and the ink cartridges are made to dispense ink as micro droplets 17 at appropriate times along the path of movement. In normal use, the ink is dispensed in a carefully controlled manner such that digitized words, numbers, letters, drawings, and images are produced on a piece of paper by the dispensed ink droplets. In the present application, however, a stencil blank 24 as described above is fed through the inkjet printer 21 and the print heads are controlled to print onto the blank an image, indicated at 26, that is to be reproduced as a stencil. The image is digitized and stored as data and thus can be downloaded from the Internet, scanned with a scanner, photographed with a camera, or any other appropriate method for capturing a digitized image that can be printed. The stencil blank for inkjet printing can include an adhesive layer, which can be applied as microdots as illustrated in FIG. 5a. In this case, the tack of the adhesive should be masked so that the adhesive does not tend to stick to transport mechanisms of the printer. This can be done is a variety of ways such as, for instance, a thin protective release layer, a silicone sheet, a water soluble protective ink receiving layer reducing the tack of the adhesive during printing, or application of talc or other fine powder to the surface during printing to reduce adhesion. Alternatively, stencil blanks for inkjet printing may be made without an adhesive layer and finished stencils may be held on a surface in an alternate matter such as mounting within a thin frame made from flexible foil with double sided adhesive that sticks to the surface.

In FIG. 5b, the stencil blank 24 with its direct-to-stencil printed mask 26 is exposed with light as described above. As mentioned, this preferably is done while the ink is still somewhat wet. Exposure of the stencil blank to light in regions not masked by the printed-on image causes the PVA SbQ photopolymer emulsion to cross-link in these regions thereby firming the emulsion. The cross-linking reaction also renders the exposed regions insoluble in water as mentioned above. Further, where the pressure sensitive adhesive layer also comprises a photopolymer, the adhesive layer also cross-links and firms in the exposed regions and becomes insoluble in water.

In contrast, in regions of the stencil blank masked by the applied ink, the ink blocks the light and the PVA SbQ emulsion in these regions does not cross-link and solidify but remains water soluble. Further, since the PVA SbQ emulsion and the pressure sensitive adhesive where it too is photosensitive are exposed together and at the same time, the alignment between the two at the edges of the exposed regions is near perfectly registered. Accordingly, when the finished stencil is applied to a wall or other surface to be decorated, the edges of the masked regions of the stencil are adhered closely and intimately to the surface around all edges of the image. This results in crisp clean lines in the applied image and also allows for the faithful reproduction of fine details in a stenciled image that heretofore have not been practical with traditional stencils. Where the adhesive is not photosensitive and not water soluble, it is applied as microdots in or onto the surface of the photosensitive emulsion. These microdots simply wash away with the emulsion when developed in water resulting again is crisp clean lines at the edges of open regions and thus crisp applied images.

Figure 6A:
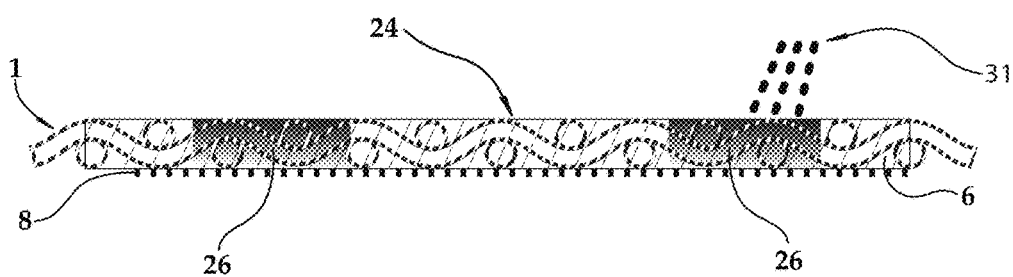
FIGS. 6a-6c illustrates the development or washing out of the exposed stencil blank with water to remove un-exposed (masked) emulsion and pressure sensitive adhesive if present to reveal unexposed open or open regions of the stencil.
Figure 6B:
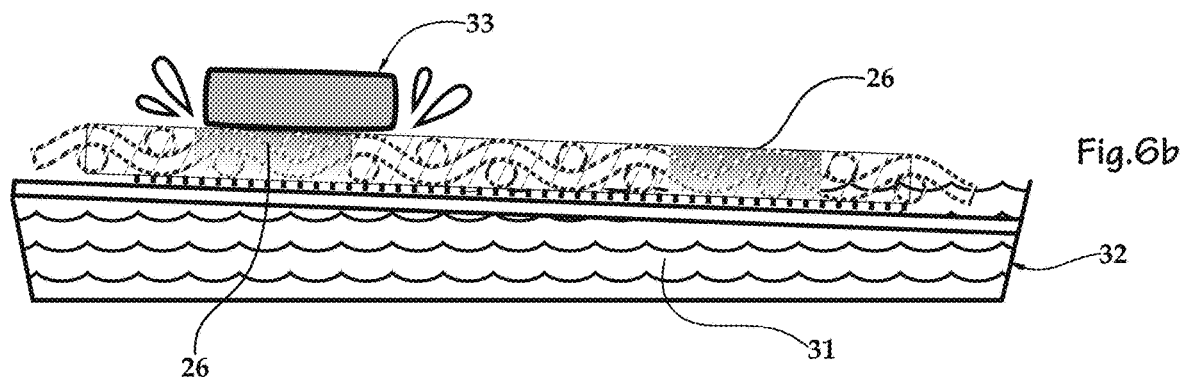
Figure 6C:
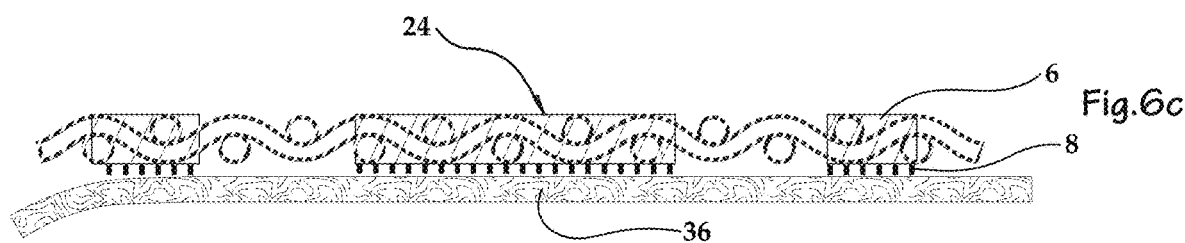

FIGS. 6a-6c illustrate the process of developing the exposed stencil blank to form the finished stencil. Due to the chemistry of the PVA SbQ emulsion, the emulsion when not cross-linked and firmed is soluble in water. Therefore, the exposed stencil blank is merely developed in water. This differs markedly from the prior art in which development involves chemicals that are not safe for use in the home or classroom. As shown in FIG. 6a, the exposed stencil is wetted on both sides with water 31. This preferably is done very quickly after exposure of the stencil blank so that the unexposed regions do not begin to cross-link from ambient light. Then, the stencil blank is placed in bath of water as shown in FIG. 6b and rubbed with a sponge 33 or like implement. This causes regions of the stencil blank that were not exposed; i.e., regions covered by the printed-on light mask, to dissolve and wash away into the water. However, regions that were not masked and were exposed to light are cross-linked and solidified and are not affected by the water. These regions therefore stay intact.

Furthermore, the pressure sensitive adhesive also is removed along with the photopolymer emulsion. If the adhesive is a continuous film of photosensitive adhesive, it too dissolves in water in regions that were masked by printed-on image. Where the adhesive takes the form of insoluble embedded or printed-on microdots 8 as shown in FIGS. 6a-c, the dots within the non-exposed regions simply wash away with the dissolving photopolymer emulsion. Alternatively, the microdots may also be photosensitive, in which case they too dissolve in the water bath. In either case, the result is a stencil having open regions wherein the underlying stencil carrier is exposed with these regions being bordered by sharp crisp edges of the exposed emulsion. The adhesive is left intact on the surrounding regions of the stencil and, where applied as a thin film, is precisely registered with the cross-linked photopolymer emulsion. Accordingly, adhesive properties of the stencil in this embodiment extend all the way to the edges that surround the open regions. This ensures that the stencil is held by the adhesive in close contact with a surface to be decorated, especially around edges, to provide an image on the surface that is crisp, clean, and detailed. Where the adhesive is present as microdots, the miniscule diameter of the dots ensures that adhesive is present at or very close to the edges that surround the open regions of the stencil. After development, excess water is absorbed from the stencil with a towel or tissue paper 36 (FIG. 6c) and the stencil is dried using, for example, a common hair dryer. The stencil is then ready to be used to apply designs to a surface.

Figure 7A:
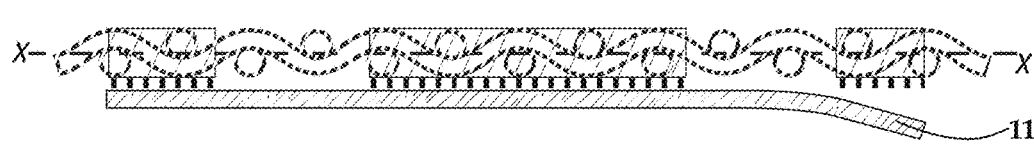
FIGS. 7a-7b illustrate the structure of a masked, exposed, and developed stencil blank according to the disclosure showing the porous carrier exposed in the open regions of the stencil through which pigment is applied.
Figure 7B:
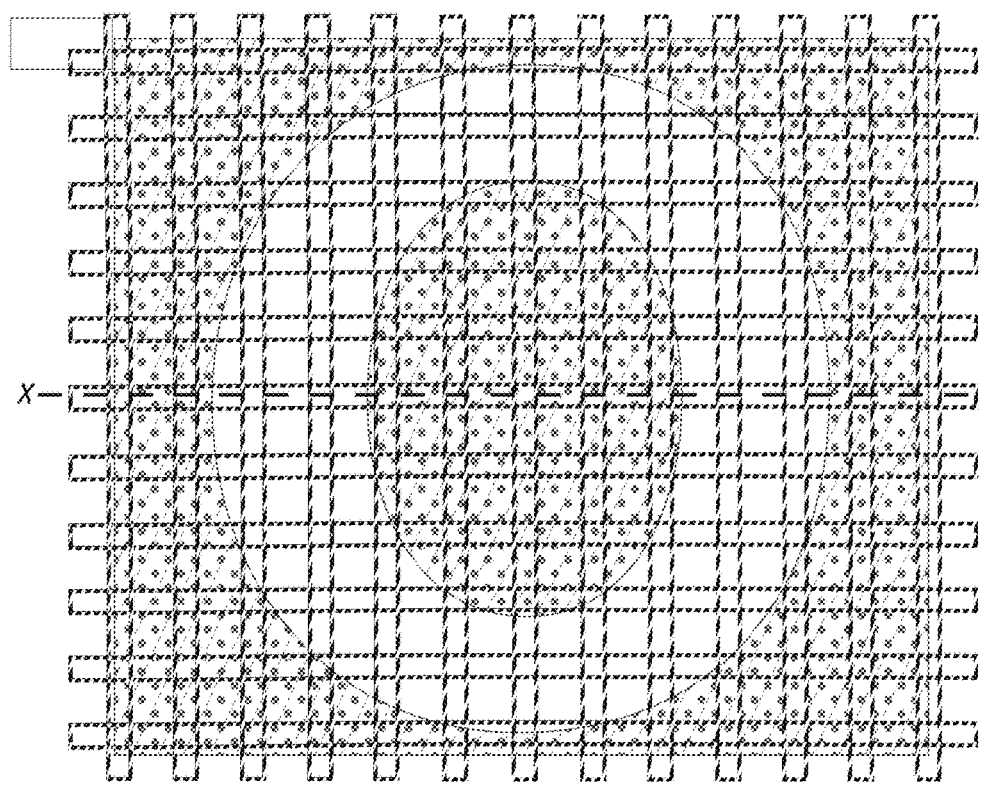
Figure 8:
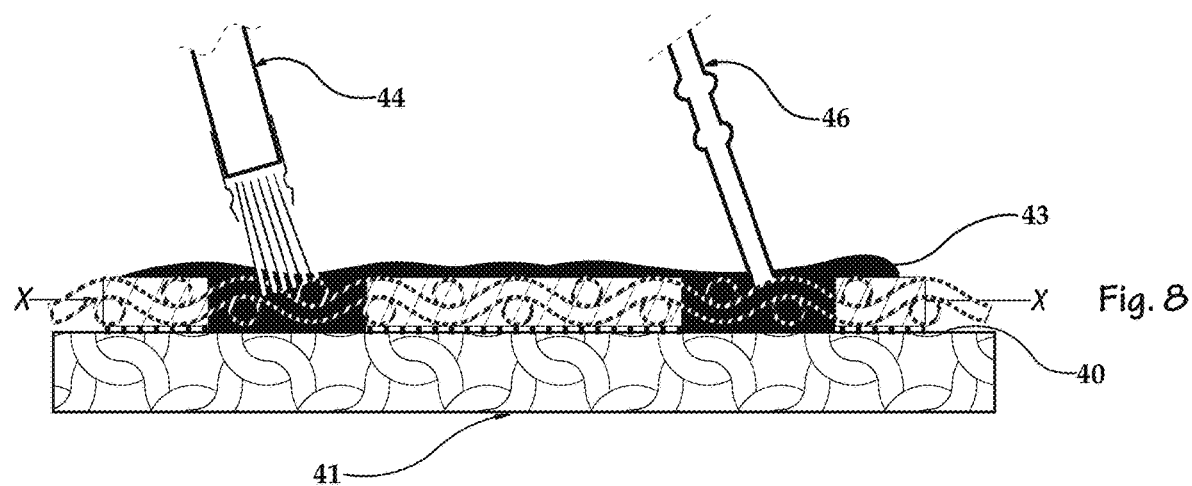
FIG. 8 illustrates an application of a graphic design to a surface through the stencil using ink or paint applied with a stencil brush or squeegee.

FIGS. 7a-7b show the finished stencil both from the edge and from the top. FIG. 7a illustrates that when the stencil is finished as described, the protective sheet 11 can be placed back onto the surface of the stencil to protect the surface and preserve the tackiness of the pressure sensitive adhesive thereon. In FIG. 7b, the image to be reproduced on a surface, the letter "O" in this case, is seen to be revealed in the stencil with the woven stencil carrier spanning the open region that defines the image. The stencil, which was made in only a few minutes, is now ready for use to apply images to a surface as illustrated in FIG. 8. More specifically, the stencil is placed onto the surface 40 of an object 41, illustrated as a fabric in this example, to be decorated. The stencil can be pressed firmly against the surface to secure the pressure sensitive adhesive, where present, to the surface and thereby hold the stencil firmly in position during use. For curved or irregular surfaces, the stencil is sufficiently flexible to conform substantially to the shape of the surface and the pressure sensitive adhesive, where present, ensures that the stencil sticks closely to the surface, especially around open regions of the stencil through which ink or paint is to be applied.

For embodiments that do not include a pressure sensitive adhesive, the finished stencil can be held to a surface to be decorated in other ways. For instance, they may simply be taped with masking tape to the surface in a traditional manner. Alternatively, the finished stencils can be mounted in a relatively thin flexible frame that itself has a pressure sensitive adhesive surface such as double sided tape. In such an embodiment, the frame is stuck to a surface to be decorated and holds the stencil in relatively intimate contact with the surface during application of art media. In yet other embodiments, to be detailed below, a stencil blank is formed with a smooth flat non adhesive surface that, despite the lack of adhesive, tends to cling to objects to be decorated due to its smoothness.

Art media 43 such as ink or paint or paste can then be applied through the open regions of the stencil using any appropriate tool such as a stencil brush 44 or an art squeegee 46. The art media is thereby transferred to the surface and reproduces thereon the image previously reproduced in the stencil. After use, the stencil can simply be peeled away from the surface 40 leaving the painted image intact on the surface. In this regard, the in-plane rigidity and structural integrity of the stencil carrier as described above ensures that the stencil pulls away cleanly to prevent smudging of the ink or paint on the surface and further ensures that the stencil does not stretch or deform, which could deform the image on the stencil. After use, the surface of the stencil need only be washed with water to rejuvenate the pressure sensitive adhesive and cleaned to remove any paint or other art media that may have clung to the stencil. The stencil can then be used again to apply the image or the protective sheet can be placed back on the adhesive surface of the stencil and the stencil stored for future use.

Figure 12A:
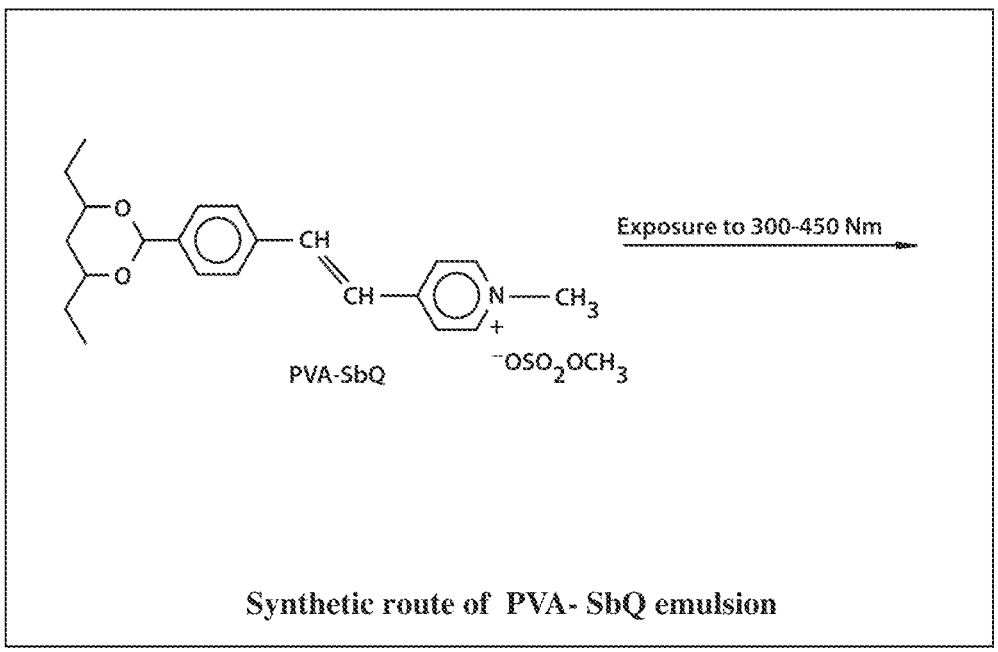
FIGS. 12a-12b show the chemical structure of PVA SbQ before and after being cross-linked by exposure to light.
Figure 12B:
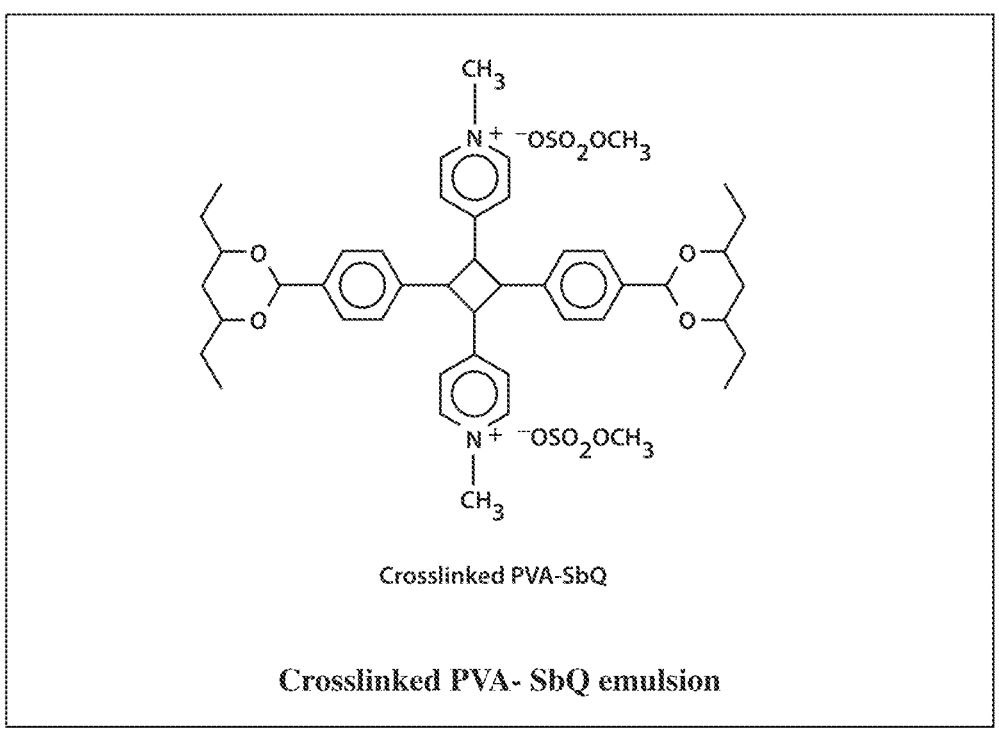

The preferred material for use as an emulsion suitable for home use and not requiring chemicals or solvents for its development is a PVA SbQ based sensitized emulsion modified as disclosed herein to obtain even shorter exposure times when exposed to light radiation above about 400 nanometers. The chemical structure of such an emulsion both before and after being cross-linked by exposure to light is shown in FIGS. 12a and 12b respectively. These emulsions exhibit significant advantages over commercial emulsions, including shorter exposure times and, perhaps more importantly, they inherently can be exposed and cross-linked by sunlight and actinic light rays ranging from 350 to 400 nanometers. Electromagnetic radiation with a wavelength of 350 nanometers is within the ultraviolet spectrum, which ranges between 10 nanometers and 400 nanometers. Light of this wavelength is therefore dangerous to the skin and eyes of humans and not suitable for home use. However, 400 nanometers is just within the visible spectrum, which ranges from 380 to 760 nanometers and thus safer for human exposure. Furthermore, the inventor has found that modifying the emulsion through the addition of certain dyes and pigmentation may positively influence the sensitivity of the emulsion at higher safer wavelengths. The inclusion of light initiators and similar substances in conjunction with such dyes and pigmentation can increase or shift the photosensitivity even more at such higher wavelengths.

Figure 13:
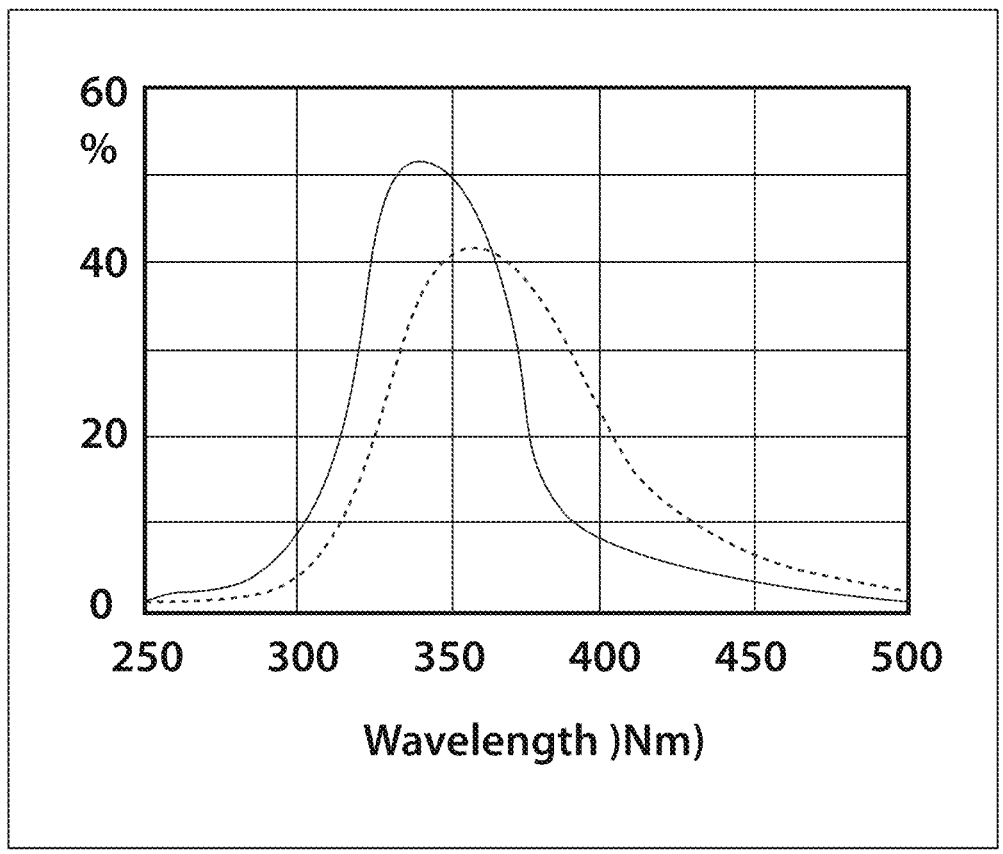
FIG. 13 is a graph illustrating an expected sensitivity graph of the photopolymer emulsion of this disclosure when augmented with fluorescein or eosin sensitizing dyes and light initiators in the emulsion.

The graph of FIG. 13 exemplifies the expected nature of this shift. While this figure does not represent actual measured shift, it is presented to illustrate the general nature of the expected shift. The solid line of the graph represents an expected light sensitivity of a PVB SbQ emulsion without the addition of pigmented dyes and light initiators. The dashed line represents an expected shift in sensitivity of the same emulsion with the addition of dyes and light initiators. It can be seen from this graph that, without the dyes and light initiators, the sensitivity of the emulsion would be expected to peak at about 335 nanometers and that its sensitivity at 400 nanometers is expected to be only about 8 percent. With dyes and light initiators, the peak sensitivity is expected to shift to about 365 nanometers, still in the ultraviolet range. However, the expected sensitivity at 400 nanometers increases almost 4 fold to about 29 percent and is virtually doubled even at 450 nanometers. Actual measurements may well differ in their particulars from the graph of FIG. 13; however, the general nature of the shift presented is believed to be substantially correct.

Figure 9:
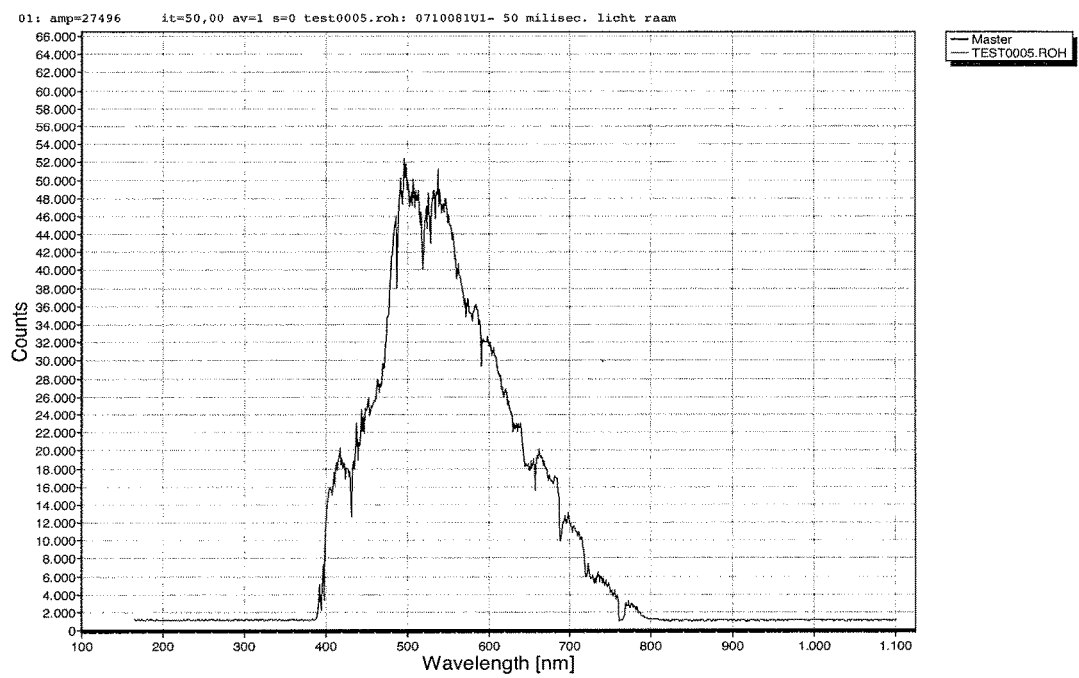
FIG. 9 is a graph showing a measured wavelength spectrum of typical indoor daylight sun.
Figure 10:
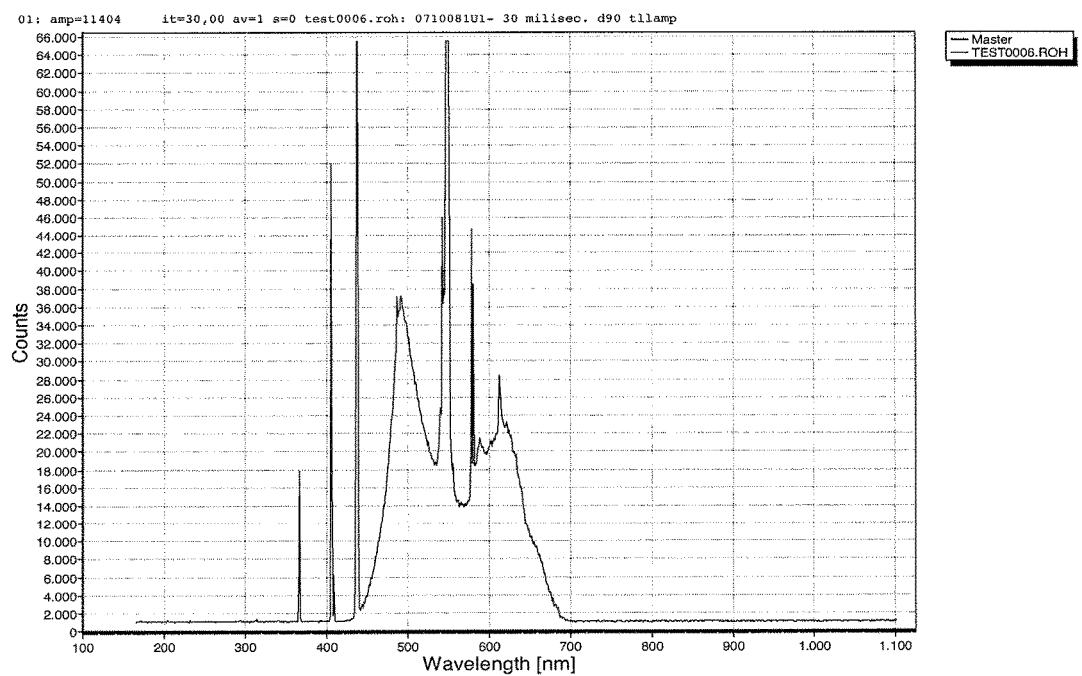
FIG. 10 is a graph showing a measured wavelength spectrum in of a typical daylight fluorescent light bulb.
Figure 11:
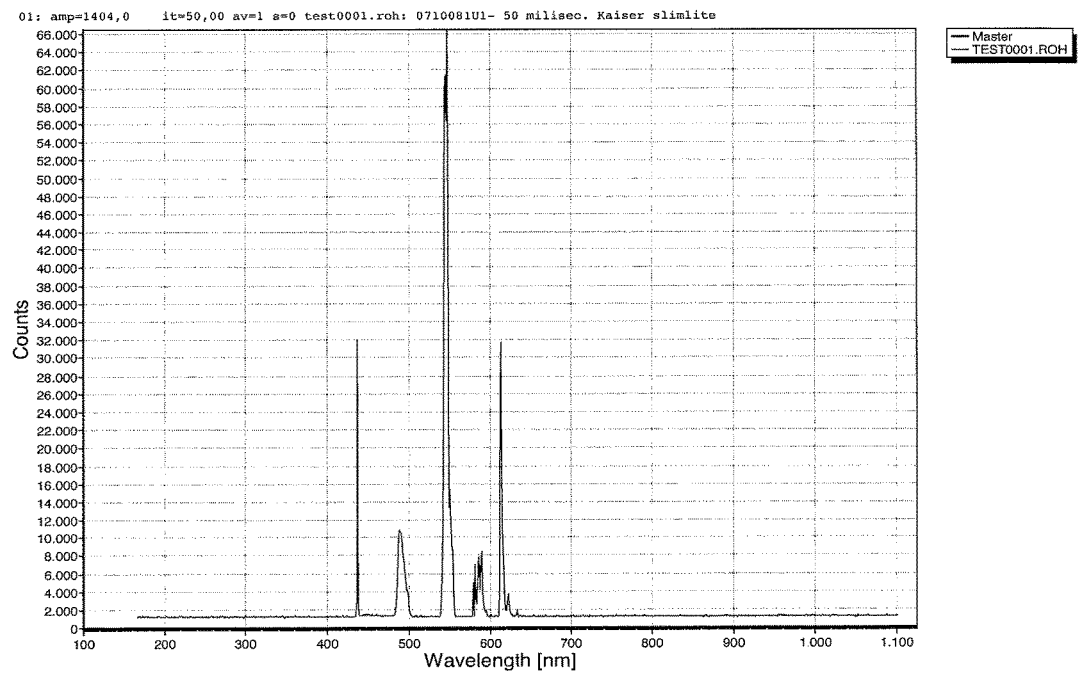
FIG. 11 is a graph showing a measured wavelength spectrum of a typical 5000° Kelvin photographic light box.

The shifted photosensitivity of the enhanced emulsion described above makes the emulsion much more suitable for exposure by common home sources of light. FIG. 9 for example is a graph of the measured intensity of light versus wavelength for sunlight shining into a dwelling through a window. While the intensity peaks around 500-550 nanometers, it can be seen that there are still substantial photon counts (intensity) registered at 400 and 450 nanometers. Similarly, FIG. 10 is a graph of measured light intensity (photon counts) versus wavelength for a Phillips® TL D 90 light bulb. Again, a significant total number of counts are produced in the portion of the spectrum between 400 and 450 nanometers, which advantageously includes two large spikes in intensity. FIG. 11 is a graph of the measured intensity of light produced by a Kaiser® Slimlight® photographic light table containing 5000° Kelvin photobulbs. Once again, significant counts are recorded between 400 and 450 nanometers and a large spike is present in this region of the spectrum to provide significant exposure within this wavelength range.

It will thus be seen that the applicant has discovered techniques for modifying and enhancing the sensitivity of a PVB SbQ photopolymer emulsion so that the sensitivity spectrum overlaps acceptably with the spectrums of light produced by numerous common home light sources and natural light sources. Thus, stencils incorporating the enhanced sensitivity emulsion are uniquely suited for use by home and classroom crafters and others since dangerously long wavelength radiation is not required for exposing the stencil blanks. Further, the capacity to be developed in water without the use of chemicals makes the stencil system of embodiments of this invention even more suitable for use at home or in classrooms.

As mentioned above, the inventor has found that feeding a stencil blank with an adhesive surface through an inkjet printer can be problematic because the adhesive can stick to transport rollers and mechanisms of the printer. One solution described above is to use stencil blanks without adhesive surfaces and to mount the finished stencils to an adhesive frame that holds them to a surface. Alternate solutions have been discovered by the inventor for making photosensitive stencil blanks, with or without an adhesive surface, with the blanks being suitable to be fed through an inkjet printer. These solutions are described in detail below with reference to FIGS. 14-17.

As a first solution, the inventor has discovered that creating a smooth flat surface on the side of the stencil that will face a surface to be decorated (the primary surface) can eliminate or greatly reduce the need for the surface to have adhesive properties. While not wanting to be bound by theory, it is believed that this is because a smooth flat surface will tend to "cling" to a surface to be decorated due to its smoothness and flatness. This cling may substitute for an adhesive layer that otherwise would stick to the surface. Accordingly, an adhesive layer is not required and the above referenced problems associated with feeding a stencil blank with an adhesive surface through an inkjet printer are ameliorated. Furthermore, the lack of concavities and other deformities in the smooth flat surface ensures that paint applied through open areas of a finished stencil will not flow into such deformities and thereby spread beneath the masked regions of the stencil. The result is an applied image with crisp clean paint lines and very fine details.

As a second solution, it has been discovered that a stencil blank can be fabricated with an adhesive surface, but with the adhesive surface being protected by a "solvent activated" (the solvent is water in the present case) non-photosensitive protective layer that functions as a non-tacky ink receiver surface when the blank is fed through an inkjet printer. Light mask images are printed onto the ink receiver surface that overlies and protects the tack of the adhesive layer. Since the protective layer is solvent activated and not light activated, it simply washes away during development of the stencil blank to reveal the adhesive surface that will stick to a surface to be decorated during use of the resulting stencil.

As a third solution, it has been discovered that a light mask can be printed on a stencil blank with the primary side (the side that will face a surface during decoration) oriented downwardly or otherwise away from the print heads and with the opposite or secondary side facing the print heads (usually upwardly). It has been discovered that the solvents in common inkjet printer ink, which may include water, cause the ink to penetrate a substantial depth into the PVA SbQ emulsion when applied by the inkjet printer heads to the secondary side of the stencil blank. Further, and somewhat surprisingly, the penetration of the solvents and the ink has been discovered to function substantially the same as if the light mask had been printed on the primary side of the stencil blank. Specifically, when a light mask is printed on the secondary side and the stencil blank is exposed and developed, a stencil is formed with open regions outside the applied ink and masked regions where the ink was applied. In addition, the resulting stencil has edges surrounding open regions that are substantially free of undercut caused by light penetrating beneath a light mask. Masks are therefore of substantially the same quality as a stencil created by printing the light mask on the primary side in terms of edge sharpness and lack of undercut.

The above solutions have given rise to additional techniques and methods of creating stencils from photosensitive stencil blanks and these methods will now be described in detail with reference to FIGS. 14-17.

Referring to the right side of FIG. 14*a*, which illustrates the first solution mentioned above, a PET or PP carrier 51 having a smooth flat and possible glossy surface is pre-coated with a thin layer or film of PVA SbQ photosensitive emulsion 52. Due to capillary action, the emulsion conforms to the smooth flat surface of the carrier as it begins to dry and thus will itself mirror the smooth flat possibly glossy surface of the carrier when the carrier is peeled away. This surface has been found to be very well suited to function as an inkjet receiver surface when printed on by an inkjet printer. Further, as mentioned above, because of the resulting smoothness and flatness, the surface tends to cling to a surface to be decorated due to surface effects without the need for adhesive.

In FIG. 14*b*, a stencil carrier 1, which is a woven carrier in this example, is applied to the pre-coated film of PVA SbQ emulsion 52 with appropriate tension. The pre-coated film can be partially dried before application of the stencil carrier if desired. In FIG. 14c, a primary coating of PVA SbQ emulsion 54 is applied to the stencil carrier so that it permeates the carrier and bonds with the thin pre-coated film of PVA SbQ emulsion 52 previously applied to the carrier 1. A stencil blank is thus created with a peal-away protective sheet provided by the PET or PP carrier 51. It has been found that the pre-coating of the thin PVA SbQ film onto the carrier eliminates deformations such as concavities on the primary surface of the stencil blank and results in a very smooth flat surface. As a result, ink is applied with crisp clean edges since the ink does not migrate into deformities on the surface of the stencil blank. Further, as mentioned above, the resulting smoothness and flatness of the primary surface tends to cling to a surface to be decorated during use of a finished stencil.

In use, the PET or PP protective sheet 51 is peeled away to reveal the smooth flat surface of the stencil blank. The blank is then fed through an inkjet printer, and a light mask is printed onto the smooth flat surface. Since there is no adhesive surface, the stencil blank feeds smoothly through the printer without sticking to transport mechanisms. The masked stencil blank is then exposed and developed in a water bath as described above to produce a finished stencil with a clingy but non-adhesive primary surface.

The left side of FIG. 14a, in conjunction with FIG. 14d, illustrates the second solution mentioned above. According to this solution, a thin coating of a solvent activated protective material 53 is pre-coated onto a PET or PP carrier 51. By solvent activated, it is meant that the protective material is soluble in a solvent, which in this case is water, but it is not activated or cross-linked by exposure to light. A preferred material for such a pre-coat layer is a water soluble PVA, although other solvent (water) activated materials may be substituted. My U.S. Pat. No. 6,332,876 describes in more detail solvent activated protective layers as a tack-reducing substance for adhesive surfaces, and this patent is hereby incorporated by reference in its entirety. Referring to FIG. 14d, an adhesive layer 55 is applied atop the pre-coated solvent activated protective layer 53. The adhesive layer can be a photosensitive pressure sensitive adhesive material as described above, a non-photosensitive adhesive applied in a microdot pattern, also as described above, or it may be a thin layer of PVA SbQ emulsion that has been rendered tacky by the addition of PSA or other tackifiers.

With continued reference to FIG. 14d, a layer of a primary coating 54 of PVA SbQ photosensitive emulsion is applied to the adhesive layer. A stencil carrier, woven in this example, is laid down into the primary coating 54 and the coating, through capillary action, substantially permeates the stencil carrier. The complex is then dried. Of course, the layers and stencil carrier can be applied in different orders and with different techniques. The result is a stencil blank having a peel-away protective sheet 51 that reveals a smooth flat ink receiving surface defined by the PVA protective layer 53. Further, the protective layer 53 blocks or greatly reduces the tack of the adhesive layer 55 so that the stencil blank can be fed through an inkjet printer smoothly without sticking. In the printer, a light mask is printed onto the protective layer 53 and the resulting masked stencil blank is exposed to light. This exposure cross-links the PVA SbQ emulsion 54 and, if the adhesive layer 55 also is photosensitive, cross-links this layer as well, outside the printed-on mask. However, the protective layer 53 is not photosensitive and thus is not cross-linked by exposure to the light.

The exposed stencil blank is then developed in a water bath as described. During development, the non-exposed portions of the mask wash away and, since it is water soluble, the protective layer 53 also washes away completely from the stencil blank. As the protective layer 53 washes away, it exposes the pressure sensitive adhesive 55, a process that may be referred to as "regenerating" the adhesive. The developed stencil is then dried as described and a peel-away protective sheet may be applied to the now exposed adhesive surface. The stencil can then be used to decorate a surface as detailed above by peeling away the protective sheet, sticking the stencil with the regenerated adhesive to a surface, and applying art media through the open regions of the stencil.

Figure 15A:
FIGS. 15a-15d illustrate a method of making a stencil blank with adhesive and also particularly suited for use with inkjet printers.
Figure 15B:
Figure 15C:
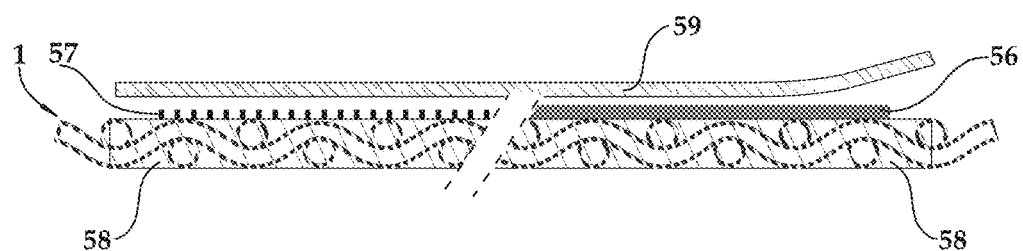

FIGS. 15a-15d illustrate making a stencil blank according to the third solution discussed above. Here, the stencil blanks are designed to receive an inkjet printed light mask on the secondary side of the blank (the side that will face away from a surface being decorated) rather than the primary side as in prior embodiments. Referring to FIGS. 15a and 15b, a stencil carrier 1 is coated with a permeating coating of a PVA SbQ photosensitive emulsion 58. An adhesive layer is applied on the primary surface of the coated stencil carrier. The adhesive coating can be applied as a continuous film as shown at 56 in FIG. 15a, in which case the adhesive preferably is a photosensitive pressure sensitive adhesive emulsion. Alternatively, the adhesive layer can be applied in a microdot pattern as indicated at 57 in FIG. 15b. In such a case, the pressure sensitive adhesive need not be photosensitive since the dots wash away with the PVA SbQ emulsion as described above.

Figure 15D:
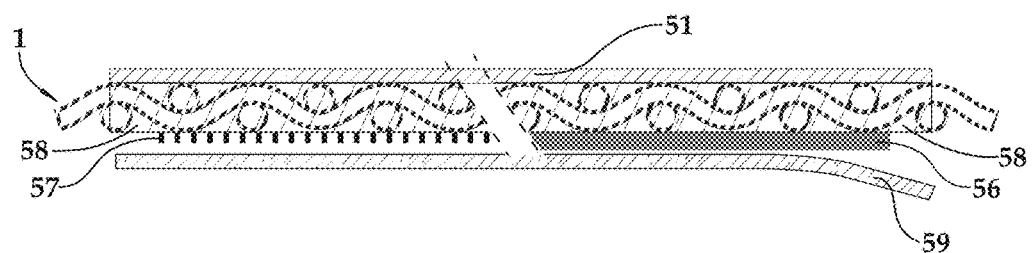

A silicone coated protective paper 59 (FIG. 15c), or other appropriate protective release sheet, is applied over the adhesive layer to protect the adhesive and to provide a non-adhesive surface on the primary side of the stencil blank. In FIG. 15d, a smooth flat substantially concavity free ink receiver surface 61 in the form of a relatively thin film is shown on the secondary side of the stencil blank. This surface can be created as described above by pre-coating a PET or PP carrier with a thin film of PVA SbQ light sensitive emulsion and bonding the PVA SbQ coating of the stencil carrier to the pre-coat film. Other methods may also be used within the scope of the invention. The pre-coat film preferably also comprises a PVA SbQ light sensitive emulsion and may be the same emulsion used to coat the stencil carrier. A stencil blank is thus created with a peel away protective sheet covering pressure sensitive adhesive on the primary side of the blank and with a smooth flat ink receiving surface without concavities or other deformities on the secondary side of the blank.

Figure 16A:
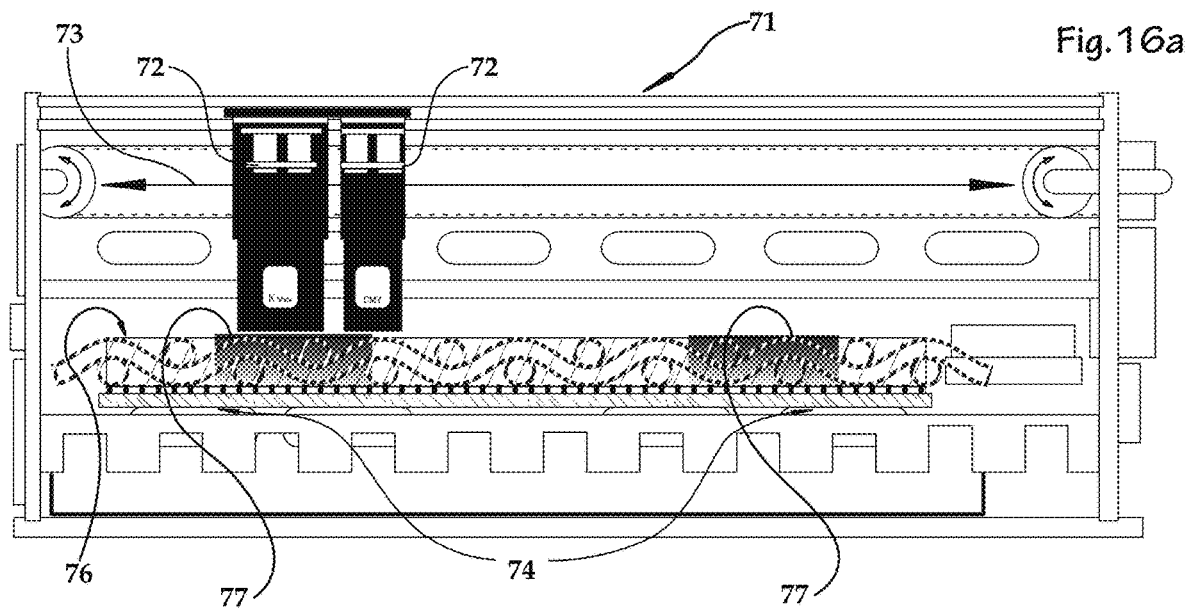
FIGS. 16a-16c illustrate the use of stencil blanks of FIGS. 14 and 15 in an inkjet printer and subsequent exposure of the blanks.
Figure 16B:
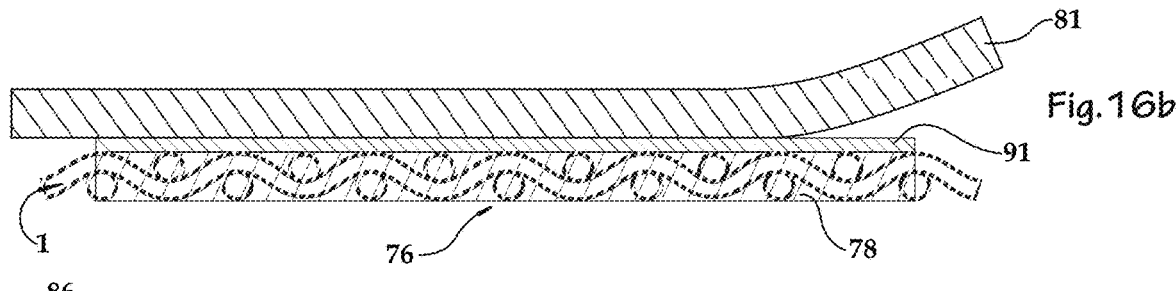

FIGS. 16a and 16b illustrate use of a simple stencil blank with no adhesive but with a smooth flat ink receiving surface according to the first solution discussed above. The inkjet printer 71 has print heads 72 that traverse back and forth in the direction of arrows 73. Transport rollers 74 along with other transport mechanisms support and move sheets through the printer for receiving ink from the print heads. As shown in FIG. 16b, a stencil blank 76 according to the first solution has a carrier 1 coated with a PVA SbQ photosensitive emulsion 78 to which a PVA SbQ ink receiving pre-coat film is bonded. A removable protective sheet 81, which served as a support carrier during manufacture of the stencil blank, is peeled away to reveal the smooth flat surface of the pre-coat film. This is the primary surface of the stencil blank.

Referring back to FIG. 16a, the just described stencil blank 76 is fed through the inkjet printer 71 with its primary smooth flat surface facing up or otherwise facing the print heads of the printer. The stencil blank is transported through the printer by the transport mechanism without sticking since there is no adhesive surface on the blank. The print heads 72 apply ink 77 to the smooth flat pre-coat surface in the desired light mask pattern. As mentioned, the smooth flat pre-coat surface results in a clean image with crisp outlines. As illustrated in FIG. 16*a*, solvents in the ink have been found to penetrate into the PVA SbQ coating of the stencil blank to a substantial depth. This, in turn, has been discovered to reduce greatly the problems related to undercutting of light beneath the edges of the pattern, which can result in a stencil with somewhat chamfered edges surrounding open regions of the stencil. The masked stencil blank may then be exposed and developed in a water bath and dried. It can then be used by applying its smooth flat primary surface to a surface to be decorated. The smooth flat surface clings to the surface so that adhesive is not required to hold it in place.

Figure 16C:
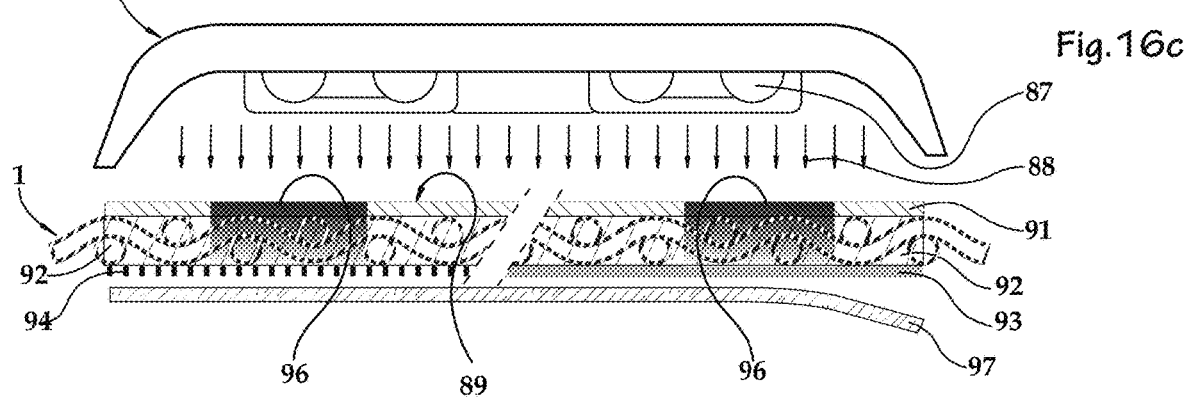

FIG. 16*c* illustrates a stencil blank according to the third solution above after having received a printed-on light mask in an inkjet printer and being exposed to radiation 88 from the light sources 87 of a light fixture 86. As described, the stencil mask 89 includes a stencil carrier 1, woven in this case, coated with PVA SbQ photosensitive emulsion 92 with a smooth flat pre-coat of PVA SbQ emulsion on its secondary side. Adhesive in the form either of a continuous coating 93 or microdots 94 is disposed on the primary side of the stencil blank and a removable protective sheet 97 covers the adhesive coating. The stencil blank 89 has been fed through an inkjet printer, which has printed a light mask 96 on the secondary surface of the blank; i.e., the surface opposite the adhesive surface. As illustrated, the solvents in the ink have penetrated relatively deeply into the PVA SbQ emulsion of the pre-coat and primary coating on the stencil carrier.

As radiation 88 from the light source 87 falls onto the secondary surface, regions outside the printed-on light mask are exposed and cross-linked so that they become insoluble in water. The regions beneath the printed-on light mask are covered and do not receive sufficient radiation to cause cross-linking. Furthermore, it has been discovered that, due to the penetration of the ink solvents into the PVA SbQ emulsion, light from the non-masked regions does not tend to undercut the edges of the printed-on mask. Rather, the penetration of the solvents blocks light that otherwise might undercut a light mask disposed only on the surface of the blank. As a result, the edges separating exposed and non-exposed regions do not exhibit a chamfered appearance but rather extend substantially transversely through the thickness of the stencil blank. It has thus been found that when the stencil mask is developed in a water bath, the edges of the open regions on the primary side of the stencil remain sharp and crisp. Printing the light mask on the secondary side of the blank therefore allows for stencil blanks with adhesive primary surfaces that still can be fed through an inkjet printer because the adhesive is covered with a protective sheet during printing. The transport rollers and mechanisms of an inkjet printer function normally to feed the stencil blank through the printer for receiving a printed-on light mask.

FIGS. 17*a*-17*c* illustrate the development of an exposed stencil blank of the third solution above in a water bath to form a stencil with open regions and masked regions. The protective sheet 97 covering the adhesive film, which in FIGS. 17*a*-17*c* is applied in a microdot pattern, is removed before development. Water 101 is sprayed on both sides of the exposed stencil blank quickly after exposure to render unexposed regions of emulsion non-photosensitive and thus prevent cross-linking in these regions caused by ambient light. The sprayed on water acts essentially as a stop bath. The exposed blank is then placed in a water bath 102 and preferably rubbed with a sponge 103 or similar item. This causes the unexposed regions along with the adhesive dots therein (or the continuous photosensitive adhesive if used) to dissolve into the water bath exposing open regions spanned by the mesh stencil carrier. A stencil is thus created. After development and drying, a protective sheet 106 can be reapplied to the adhesive to protect it until use. Alternatively, the stencil can be used immediately by sticking its primary side to a surface to be decorated with the adhesive engaging and sticking to the surface. As mentioned above, and as shown in FIG. 17*b*, the penetration of the ink solvents into the PVA SbQ emulsion results in crisp edges on the primary side of the stencil and substantially eliminates undercutting that might otherwise compromise the integrity of these edges.

Fabrication of Stencil Blanks

1. Direct Coating of the Stencil Carrier

A woven mesh stencil carrier can be coated with photopolymer emulsion and by a batch process, generally carried out under safelight conditions using industry standard coating equipment. The techniques described above may be carried out on this to result in a semi-continuous web process if desired. For example, a fixture frame can be used to support a length of the woven stencil carrier and the carrier can be linearly stretched or tensioned and clamped to the frame. A relatively low tension is required to provide a carrier web sufficiently stable to enable the coating heads of the coating machine to apply emulsion and/or pressure sensitive adhesive with consistency over the entire surface of the carrier. A PET support sheet may be laminated to the stencil carrier to application of the emulsion if desired to create a smooth flat surface of the emulsion that functions as an inkjet receiving surface. The stencil carrier can be single or double coated with a photopolymer emulsion and/or with photosensitive or non-photosensitive pressure sensitive adhesive. For example, a coat of photopolymer emulsion may be applied first and partially dried by a forced air drying system such as an air knife.

A layer or film of pressure sensitive adhesive may be applied if desired to the stencil carrier either simultaneously to the opposite side of the carrier, or serially to either side, and dried. When applied as a film, the pressure sensitive adhesive preferably is itself a photosensitive photopolymer emulsion. When applied as microdots, the adhesive need not be a photopolymer and need not be photosensitive. The coated stencil carrier may then be released from the fixture frame and the carrier exposed to a forced air dryer to be thoroughly dried. The resulting stencil blank web can be wound into a roll if desired for bulk storage and the process repeated to fabricate another web. The coated and dried stencil blank web or webs can be cut into stencil blank sheets for packing or for further processing as desired. Preferably, the sheets are stored in light and moisture packaging to protect the emulsions and prevent cross-linking from occurring until the blanks are ready to be exposed to light.

2. Use of a Temporary Support Carrier

In an alternate fabrication technique, the photopolymer emulsion may be coated under safelight conditions and in a continuous process onto a polyester temporary support web that may or may not have release properties. Optionally, the photopolymer emulsion may be coated in a continuous process onto a polyethylene terephthalate (PET) or a Polypropylene (PP) extruded and calendared release paper web. Pressure sensitive adhesive may be pre-applied to the temporary support web and, if the adhesive is applied as a continuous film, the adhesive also is photosensitive. Alternatively, no adhesive need be applied for embodiments that do not include an adhesive surface. The emulsion may then be partially dried. A web of woven or nonwoven stencil carrier material may then be guided into the emulsion coating on the polyester or polypropylene extruded release paper carrier. In the process, the web tension is controlled so that the web engages the photo masking emulsion evenly and with the proper pressure. In this process, the capillary capacity of the stencil carrier absorbs the photo emulsion and ensures that the emulsion permeates the stencil carrier fully and evenly. This process thus avoids the necessity to provide top filmic support as in direct coating techniques and is therefore more suitable for the use with water based photopolymer emulsion coatings that are safe for use in home hobby products.

The emulsion with embedded stencil carrier and pressure sensitive adhesive, when present, may then be dried by evaporating the water content out of the coated stencil carrier under controlled forced air drying conditions. When using the modified and enhanced light sensitive PVA SbQ photopolymer emulsion detailed above, it is important to remove the moister content from the emulsion formulation in order to optimize the light sensitivity of the emulsion. This is because water and moisture on or within the emulsions can act as a light mask that prevents the cross-linking of the photopolymer emulsion in the region of the moisture during exposure.

The resulting web can then be cut into sheets of stencil blanks if desired. The PET film or PP extruded paper support web then functions as a protective layer to cover and protect the emulsion and pre-coated pressure sensitive adhesive when present and remains and is delivered with the product for this purpose. When a user purchases and is ready to use a stencil blank, the protective support web can be peeled away to reveal the pressure sensitive adhesive for sticking a stencil to a surface to be decorated, or the flat smooth protective solvent activated inkjet receiving surface where present. After use, the support web can be reapplied to protect the stencil until the next use.

3. Differential Adherence Stencils

For some applications it is preferred to enhance the stencil border to provide greater adhesive strength around the boarder and to minimize the adhesive strength on the operative part or field of the stencil. This may be desired, for example, to avoid accidental peeling of the paint from a decorated surface or lifting a decorated textile from a supported surface when the stencil is removed after use. To fabricate such a stencil according to one embodiment of the invention, a full coverage pressure sensitive adhesive coating as described in 1 and 2 above is not applied. Instead a differential precision controlled application of pressure sensitive adhesive may be created by using screen-printing techniques or digital printing techniques. This process preferably is carried out on stencil blank sheets that may have been cut from webs created according to techniques 1 and 2 above, or another technique. The pressure sensitive adhesive is applied to the border of each sheet with higher concentration than it is applied to the interior portion or field of each sheet. The boarder of a stencil is therefore rendered tackier than the field of the boarder where an image will exist. In the preferred embodiment, the pressure sensitive adhesive emulsion is applied in the form of spaced microdots as discussed above and need not itself be photosensitive.

The pressure sensitive adhesive preferably is formulated to migrate partially into the underlying photopolymer emulsion to which it is applied and also is formulated with minimal film forming and cohesion properties. This results in precise shearing of the PSA layer during water development of an exposed stencil so that the adhesive layer follows precisely the photo emulsion image, and particularly the edges of open regions of the image through which paint will be applied. The extra adhesive strength around the border of the stencil ensures good contact during exposure between an original design on paper or film where such is used. Perhaps more salient, after the stencil is exposed, developed, and dried, the enhanced tack around the border of the stencil helps hold the stencil in place on a surface as the surface is decorated. However, the reduced tack in the field portion of the stencil reduces instances where the underlying surface coating is pulled away when the stencil is removed from the surface.

The variation of tack with such stencils can be achieved with a pattern screen printed adhesive applied in regular or stochastic dots corresponding with the open areas of the woven or nonwoven stencil support. The open micro structure between the micro dots improves the photo emulsion development during the wash-off phase to allow the penetration of water to the unexposed images, thus resulting in improved and shorter development times.

4. Direct Printing Method

This stencil blank fabrication method is used with a pressure sensitive adhesive offering more flexibility in deposit and minimizes concaving affects of the stencil surface and adhesive for highly detailed reproductions with very precise edges. The photopolymer emulsion and microdot pattern coated adhesive, perhaps with differentiation in tack, are printed onto a release treated support web made from polyester or polypropylene extruded paper as mentioned above. The surface of the support carrier is substantially flat and smooth for purposes detailed below and will remain with the final stencil blank product as a protective sheet until removed by a user. In the present method, the stencil carrier is laminated to the dried film and/or microdot pattern printed pressure sensitive adhesive. Photo emulsion is then applied to the stencil carrier by air-knife or scoop squeegee that enables differential deposits or thickness. The photo emulsion thus penetrates through the open structure of the stencil carrier and flows onto the smooth surface of the support carrier and around the microdots of pressure sensitive adhesive. This results in an emulsion with a substantially flat smooth surface mirroring the surface of the support web and with the adhesive dots being embedded or encapsulated within the photo emulsion with only a small portion being exposed at the surface of the emulsion. This, in turn, ensures very precise bridging and eliminates concavities or dimples caused by the open stencil carrier structures. The mirror image of the flat surface of the support carrier results in optimum concave-free contact with a surface to be decorated so that there are no gaps at the edges of the image where paint can flow beneath an edge during the decorative application.

Testing and Examples

Sample formulations of photopolymer emulsion and photopolymer pressure sensitive adhesive where prepared to test the exposure, development and cross-linking resulting from combinations of the above fabrication techniques with the following formulations. Required exposure times were tested under different light sources and conditions.

Formulations

Formula 1 (Emulsion)
A pure photo-polymeric emulsion 8.0% PVA-SbQ
8.0% Polyvinyl acetate 8.0% Photo polymer (acryl melamine)
76% Water
Formula 2 (Emulsion)
A second pure photo-polymeric emulsion 5.0% PVA-SbQ
33.0% PVA c Dispersion
2.0% Plasticizer Citric-acid based
0.3% Red or Blue Pigment
0.6% Additives (defoamers, preservatives) 60.0% Water
This emulsion is characterized by long self-live, with a good resistance against solvents, water, and reusable.
Formula 3 (Adhesive)
Photo pressure sensitive adhesive emulsion 42.0% Polyvinyl acetate copolymer PSA* 18.45% PVA-SbQ
15.0% Plasticizing substance
5.0% Glycerin
0.5% Fluorosurfactant
0.05% Diazo Dye
19.0% Water
*PSA compound with 55% solids Formula 4 (Microdot Adhesive)
Aqueous dispersion of a Copolymer based on:
23% Acrylic ester, Meth-acrylic ester, Vinyl ester
15% Barium Sulfate
2% Fumed Silica
2% Glycol Acid-n-Butyl ester
58% Water A stencil complex was prepared with a stencil carrier comprising a pretreated Sefar Swiss cloth e 43/80 W. Fabrication methods 1 and 3 were used as well as the printed differential tack fabrication method (method 3 above) to create stencil blanks using the pressure sensitive adhesive formulation 4 above. The pressure sensitive adhesive was applied in a 150/200 μm micro dot pattern and was air dried at 80 degree Celsius. The samples were interleaved with 42 gram vegetable silicone coated protective release paper, underwent moisture extraction in a 45% relative humidity environment, and were packed in a black 100 μm light protective polyethylene sealed foil. These stencil blanks were used for the testing described below. Webs from fabrication methods 1-2 were cut into sheets and the sheets fabricated according to methods 3-4 above are packaged in light tight packaging with moister barrier coated and air sealed polypropylene bags with moister absorbing desiccant crystal strips.

Cross-linking of the water soluble PVA SbQ (see FIG. 12) photopolymer materials can be affected simply by subjecting the materials to actinic light rays. However, in order to obtain a higher degree of insolubilization and a faster reaction under safe working conditions without using extensive ultraviolet light, it is preferred to affect the reaction and cross linking in the presence of catalytic amounts of activating dyes. Thus, red pigment and Diazo dye were used in formulations 1 and 2 above.

For use at home and in classrooms, for example, it is preferred to avoid exposure to ultraviolet short wavelength light and thus to provide for a photopolymer emulsion reaction that proceeds at safe visible wavelengths without the necessary for skin and eye protection. To improve the light sensitivity at longer and safer wavelengths of radiation, the inventor has found synergistic effects by the addition of dyes such as fluoreosin (tetrabroomfluorescein) or eosin, both of which are water soluble, to extend the actinic sensitivity. Eosin can be used as initiator to promote photosensitivity above a 400 nanometer wavelength, which falls within the visible spectrum, in order to minimize the ultraviolet short wave exposure to human skin and eyes of the non professional user. The expected shift in sensitivity to wavelength obtained is illustrated in FIG. 13, which was discussed at some length above.

The emulsion materials may be exposed from any source and of any type. The light source should preferably, although not necessarily, produce at least a small but safe amount of ultraviolet radiation. Suitable sources of light include sunlight, daylight, mercury vapor lamps, fluorescent lamps, photographic flood lamps, tungsten lamps, LEDs, EL foils, and CCFL Tubes. The measured spectra of some of these sources are illustrated in the graphs of FIGS. 9-11, which are discussed in more detail above.

For initiating the photochemical cross-linking of the PVA SbQ emulsion, a very strong light source is not needed. Indeed, in most of the examples described below, a daylight color Fluorescent, CCFI, or LED light source, placed at various distances from a stencil blank is used. Brighter light sources are generally not needed since at these relatively low light intensities the photo chemical cross-linking influence under the addition of reactive dyes is sufficient. Fluorescein, for example, has an absorption maximum at 494 Nanometer. By exploring improvements and the utilization of the synergistic agents such as dyes and initiators, it was found that reasonably short exposure can result in total cross-linked emulsions and high quality polymeric masks with a minimal presence of ultraviolet light.

The spectrum was measured from a photographic film inspection light box from Kaiser Fototechnik GmbH, type 2422, 19 Watt, with two CCFL tubes at 5000° Kelvin including a PET diffusing sheet behind an Acrylic transparent cover was tested. No measurable ultraviolet radiation was detected by a Beltron GmbH, Milli-Joule scale wave length 250 to 410 nanometer type 5310600 calibrated and certified 2009. The test was conducted during a prolonged time of ten minutes in direct contact with the front Acrylic light panel of the light box, and no readings were found in the ultraviolet regions of the spectrum. To verify the Beltron 5310600 measurements, an Avantus spectro meter S/N:07 1008 1U 1 with Ava Software 7.2 was used for secondary measurements.

FIGS. 9-11, discussed above, illustrate the measured spectra of various light sources under various conditions. FIG. 9 shows the intensity spectrum measured for inside daylight; i.e., daylight filtering through a window into a room. FIG. 10 shows the resulting measured intensity from a TL Fluorescent light bulb—Phillips color D-90. FIG. 11 shows the resulting intensity spectrum for the Kaiser type 2422 photo inspection light box mentioned above with which a number of test samples of stencil blanks were exposed.

A number of sample stencil blanks using the combination of fabrication methods and formulations described above in order to quantify the cross-linking efficiency of the polymer. Some of these tests are described as follows.

Test 1

Light mask printed with an HP PSC 1310 InkJet printer on white 80 gram/m² office copy paper. The resulting light mask sheet was laid atop test stencil blanks and the blanks were variously exposed as follows:

Direct Sun* outside light exposed for 2 minutes.
Direct Sun* inside behind non coated glass exposed for 4 minutes.

Indirect Sun* inside room non-coated glass exposed for 10 minutes.
Kaiser light box direct contact exposed for 10 minutes.

Test 2

Light mask printed with an HP PSC 1310 inkjet printer on transparent vellum film paper 120 gram/m². The resulting light mask sheet was laid atop stencil test blanks and the blanks were variously exposed as follows:
Direct Sun* outside light exposed for 1 min.
Direct Sun* inside behind non-coated glass exposed for 2 min.
Kaiser light box direct contact exposed for 5 min.
*12.15 hours on Mar. 29, 2010—Latitude 52° 05'-North, Longitude: 4° 24'-East.

Tests 3a and 3b (3a) A light mask was direct printed on a stencil blank using an HP Photosmart® B109 inkjet printer. The image was printed in reverse using an Adobe Acrobat driver. The printer driver settings were set to paper, best quality and advanced settings with color mode set to RGB.

(3b) A light mask was printed directly onto a stencil blank using a Canon 620 inkjet printer. The image was printed in reverse using an Adobe Acrobat printer driver. The printer driver settings were set at High quality advanced settings with color mode set to RGB.

Both of the above printers were loaded with the original manufacturer's ink cartridges.

The printed Stencil blank sheets were variously exposed as follows:
Direct Sun* outside light exposed for 30 sec.
Lightly Clouded* outside light exposed for 1 min.
2 TL Lamps of 9 Watt at 60 mm distance exposed for 30 sec. Lamps peak spectrum 360 to 400 Nm.
*12.15 hours—May 15—Latitude: 52° 05'-North, Longitude: 4° 24'-East.

The exposed stencil blank samples from the above tests where each developed with tap water to form stencils, dried with warm air, and used to apply decorative images using water base acrylic paint on textile and home decoration. Each stencil was then cleaned with water and soap and reused a second time. The resulting applied decorations proved to be crisp and clean with sharp edges and vivid details. This suggests that the cross-linking of the photo emulsion was complete under the tested conditions, that the edges created around open regions of the emulsion during development were clean, and that the adhesive provided close intimate contact between the surface being decorated and the stencil mask to prevent seepage of paint beneath masked portions of the stencil. More specifically, the adhesive proved to close the gaps between the surface being decorated and the surfaces of the masked portions of the stencils.

Further, the stencil complex is sufficiently flexible to be wrapped about curves and concavities of a surface to be decorated by manually pressing the pressure sensitive adhesive until complete adherence of the stencil material to the object surface is achieved. Air bubbles are removed and any lifted areas are placed firmly to the surface to ensure that all edges, both exterior and interior, are disposed firmly against the surface to be decorated. The stencil blank complex is closely adhered to the object surface at all points of contact including the interior design edges and the exterior sheet edges alike. Art medium such as ink, paint, ceramic glazing and the like can then be applied to the object surface through the stencil's open regions by means of a stencil brush, spatula or squeegee, and the resulting image created on the surface is crisp, clean, highly detailed, and free of seepage, runs, and other mishaps that might otherwise ruin the applied image.

The invention has been described above in terms and within the context of preferred embodiments and methodologies considered by the inventor to represent the best modes of carrying out the invention. However, a variety of additions, deletions, and modifications, both subtle and gross, of the illustrated embodiments might well be made by those of skill in the relevant art. In general, in the following claims, the terms used should not be construed to limit the claims to the specific embodiments disclosed in the specification and the claims, but should be construed to include all possible embodiments along with the full scope of equivalents to which such claims are entitled.

What is claimed is:

1. A method of making a stencil, comprising making a stencil blank and subsequently making a final stencil from the stencil blank, said method comprising:
  I) making the stencil blank by:
    a) providing a support carrier having a smooth flat surface;
    b) pre-coating the smooth flat surface of the support carrier with a film of photosensitive emulsion for forming a pre-coated emulsion film having a smooth flat surface with no concavities mirroring the smooth flat surface of the support carrier, wherein said smooth flat surface of the pre-coated emulsion film functions both as a light-mask receiving surface during the subsequent use of the stencil blank for making a final stencil and as a primary surface of the final stencil to cling to a surface to be decorated due to the smooth surface without the need for adhesive;
    c) partly drying the pre-coated emulsion film to form a partly dried, pre-coated emulsion film;
    d) applying a stencil carrier to the partly dried, pre-coated emulsion film, said stencil carrier having openings sized to pass art media including at least one of inks, paints, pastes and fillers;
    e) applying a primary coating of photosensitive emulsion to the stencil carrier so that it permeates the openings of the stencil carrier and bonds with the pre-coated emulsion film, said primary coating having an uncovered surface facing away from the support carrier, wherein said photosensitive emulsion used for the pre-coated emulsion film and the primary coating comprises a photopolymer emulsion including a polyvinyl alcohol with pendent styrylpyridinimm emulsion (PVA SbQ emulsion) that is treated with an eosin initiator to promote photosensitivity above a 400 nanometer wavelength, is soluble in water in its native state, and is formulated to become insoluble to water when exposed to radiation within a spectrum of visible light having wavelengths greater than about 400 nanometers during said subsequent use of the stencil blank, thereby becoming firm and fixed in the stencil carrier;
    f) drying the pre-coated emulsion film and the primary coating to form a dried photosensitive structure that remains photosensitive for subsequent generation of a user-defined mask during exposure of the dried photosensitive structure to a light source by an end user;

g) removing the support carrier from the dried photosensitive structure to form a final stencil blank including the stencil carrier embedded in the dried photosensitive structure but not including the support carrier; and h) providing the final stencil blank in an unmasked, photosensitive, flexible sheet form that is adapted to be fed through an ink-jet printer like a flexible sheet of paper to generate a light mask prior to exposure to the light source during the making of the final stencil by the end user, wherein said final stencil blank comprises a primary outer surface formed by said smooth flat surface of the pre-coated emulsion film from which the support carrier has been removed, and a secondary outer surface, opposite to the primary outer surface, formed by said uncovered surface of the primary coating;

and

II) making the final stencil from the final stencil blank by:

i) creating the light mask over a selected portion of the final stencil blank on the primary outer surface thereof, wherein creating the light mask includes passing the final stencil blank in the unmasked, photosensitive, flexible sheet form without a rigid support frame or other rigid support structure through an ink-jet printer via transport rollers of the ink-jet printer that engage and move the final stencil blank like a flexible sheet of paper through the ink-jet printer, and forming said light mask by the ink of the ink-jet printer on the primary outer surface of the final stencil blank, thereby forming a light-masked stencil blank;

j) exposing the light-masked stencil blank to light having wavelengths greater than about 400 nanometers, the exposure rendering unmasked portions of the photosensitive emulsion non-soluble in water, thereby creating a light-exposed stencil blank;

k) developing the light-exposed stencil blank with water to dissolve and remove said selected portion of the photosensitive emulsion covered by the light mask to create the final stencil with the stencil carrier and the openings thereof being exposed within the selected portion; and l) drying the final stencil.

2. The method as claimed in claim 1, wherein the stencil carrier comprises a woven material and the openings of the stencil carrier are defined by crisscrossing filaments of the woven material.

3. The method as claimed in claim 1, wherein the stencil carrier comprises a non-woven material and the openings of the stencil carrier are formed by micro perforations extending through the non-woven material.

4. The method as claimed in claim 1, wherein the photosensitive emulsion comprises a photopolymer emulsion including a polyvinyl alcohol with pendent styrylpyridinimm emulsion (PVA SbQ emulsion).

5. The method as claimed in claim 1, wherein the photosensitive emulsion comprises a photopolymer emulsion including selected dyes for enhancing the sensitivity of the photopolymer emulsion.

6. The method as claimed in claim 1, wherein the photosensitive emulsion comprises a photopolymer emulsion including light initiators for enhancing the sensitivity of the photopolymer emulsion.

7. The method as claimed in claim 1, wherein the photosensitive emulsion is formulated to become insoluble to water when exposed to radiation within a spectrum of visible light comprising wavelengths greater than about 400 nanometers.

8. A method of making a stencil, comprising making a stencil blank and subsequently making a final stencil from the stencil blank, said method comprising:

I) making the stencil blank by:

a) providing a support carrier having a smooth flat surface;

b) applying a coating of a water soluble protective material on the smooth flat surface of the support carrier for forming a water soluble protective layer;

c) applying an adhesive layer on the protective layer;

d) pre-coating the adhesive layer with a film of photosensitive emulsion for forming a pre-coated emulsion film having a smooth flat surface with no concavities mirroring the smooth flat surface of the support carrier;

e) partly drying the pre-coated emulsion film to form a partly dried, pre-coated emulsion film;

f) applying a stencil carrier to the partly dried, pre-coated emulsion film, said stencil carrier having openings sized to pass art media including at least one of inks, paints, pastes and fillers;

g) applying a primary coating of photosensitive emulsion to the stencil carrier so that it permeates the openings of the stencil carrier and bonds with the pre-coated emulsion film, said primary coating having an uncovered surface facing away from the support carrier, wherein said photosensitive emulsion used for the pre-coated emulsion film and the primary coating comprises a photopolymer emulsion including a polyvinyl alcohol with pendent styrylpyridinimm emulsion (PVA SbQ emulsion) that is treated with an eosin initiator to promote photosensitivity above a 400 nanometer wavelength, is soluble in water in its native state, and is formulated to become insoluble to water when exposed to radiation within a spectrum of visible light having wavelengths greater than about 400 nanometers during said subsequent use of the stencil blank, thereby becoming firm and fixed in the stencil carrier;

h) drying the pre-coated emulsion film and the primary coating to form a dried photosensitive structure that remains photosensitive for subsequent generation of a user-defined mask during exposure of the dried photosensitive structure to a light source by an end user;

i) removing the support carrier from the protective layer to form a final stencil blank including the stencil carrier embedded in the dried photosensitive structure but not including the support carrier; and j) providing the final stencil blank in an unmasked, photosensitive, flexible sheet form that is adapted to be fed through an ink-jet printer like a flexible sheet of paper to generate a light mask prior to exposure to the light source during the making of the final stencil by the end user, wherein said final stencil blank comprises a primary outer surface formed by the protective layer from which the support carrier has been removed, and a secondary outer surface, opposite to the primary outer surface, formed by said uncovered surface of the primary coating;

and

II) making the final stencil from the final stencil blank by:

k) creating the light mask over a selected portion of the final stencil blank on the primary outer surface thereof, wherein creating the light mask includes passing the final stencil blank in the unmasked, photosensitive, flexible sheet form without a rigid support frame or other rigid support structure through an ink jet printer via transport rollers of the ink-jet printer that engage and move the final stencil blank like a flexible sheet of paper through the ink-jet printer, and forming said light mask by the ink of the ink-jet printer on the primary outer surface of the final stencil blank, thereby forming a light-masked stencil blank;

l) exposing the light-masked stencil blank to light having wavelengths greater than about 400 nanometers, the exposure rendering unmasked portions of the photosensitive emulsion non-soluble in water, thereby creating a light-exposed stencil blank;

m) removing the protective layer from the adhesive;

n) developing the light-exposed stencil blank with water to dissolve and remove said selected portion of the photosensitive emulsion covered by the light mask to create the final stencil with the stencil carrier and the openings thereof being exposed within the selected portion; and o) drying the final stencil.

9. The method as claimed in claim 8, wherein the stencil carrier comprises a woven material and the openings of the stencil carrier are defined by crisscrossing filaments of the woven material.

10. The method as claimed in claim 8, wherein the stencil carrier comprises a non-woven material and the openings of the stencil carrier are formed by micro perforations extending through the non-woven material.

11. The method as claimed in claim 8, wherein the photosensitive emulsion comprises a photopolymer emulsion including a polyvinyl alcohol with pendent styrylpyridinimm emulsion (PVA SbQ emulsion).

12. The method as claimed in claim 8, wherein the photosensitive emulsion comprises a photopolymer emulsion including selected dyes for enhancing the sensitivity of the photopolymer emulsion.

13. The method as claimed in claim 8, wherein the photosensitive emulsion comprises a photopolymer emulsion including light initiators for enhancing the sensitivity of the photopolymer emulsion.

14. The method as claimed in claim 8, wherein the photosensitive emulsion is formulated to become insoluble to water when exposed to radiation within a spectrum of visible light comprising wavelengths greater than about 400 nanometers.

* * * * *